(12) United States Patent
Egami et al.

(10) Patent No.: US 7,998,567 B2
(45) Date of Patent: Aug. 16, 2011

(54) COATING LIQUID FOR FORMATION OF PROTECTIVE FILM FOR SEMICONDUCTOR PROCESSING AND METHOD FOR PREPARATION OF THE SAME

(75) Inventors: Miki Egami, Kitakyushu (JP); Hiroki Arao, Kitakyushu (JP); Akira Nakashima, Kitakyushu (JP); Michio Komatsu, Kitakyushu (JP)

(73) Assignee: JGC Catalysts and Chemicals Ltd., Kawasaki-shi, Kanagawa (JP)

( * ) Notice: Subject to any disclaimer, the term of this patent is extended or adjusted under 35 U.S.C. 154(b) by 1131 days.

(21) Appl. No.: 11/665,747

(22) PCT Filed: Oct. 11, 2005

(86) PCT No.: PCT/JP2005/018668
§ 371 (c)(1),
(2), (4) Date: Apr. 19, 2007

(87) PCT Pub. No.: WO2006/043439
PCT Pub. Date: Apr. 27, 2006

(65) Prior Publication Data
US 2009/0061199 A1  Mar. 5, 2009

(30) Foreign Application Priority Data
Oct. 20, 2004  (JP) ................. 2004-305662

(51) Int. Cl.
*B32B 3/26* (2006.01)
(52) U.S. Cl. ................. 428/304.4
(58) Field of Classification Search .......... None
See application file for complete search history.

(56) References Cited

U.S. PATENT DOCUMENTS

| 6,261,357 B1 * | 7/2001 | Egami et al. ........... 106/287.1 |
| 6,406,794 B1 * | 6/2002 | Shiota et al. ........... 428/447 |
| 2003/0109633 A1 * | 6/2003 | Kobayashi et al. ........ 524/588 |
| 2004/0110379 A1 | 6/2004 | Yoshioka et al. |
| 2004/0110896 A1 | 6/2004 | Yoshioka et al. |
| 2006/0009575 A1 | 1/2006 | Nakashima |
| 2006/0084277 A1 | 4/2006 | Nakashima et al. |

FOREIGN PATENT DOCUMENTS

| JP | 2003-41191 | | 2/2003 |
| JP | 2003-171616 | | 2/2003 |
| JP | 2003041191 A | * | 2/2003 |
| JP | 2004-277463 | | 10/2004 |
| JP | 2005-327757 | | 11/2005 |

* cited by examiner

*Primary Examiner* — Melvin Mayes
*Assistant Examiner* — Stefanie Cohen
(74) *Attorney, Agent, or Firm* — Leydig, Voit & Mayer, Ltd.

(57) ABSTRACT

Disclosed is a coating liquid for forming a protective film having high film strength and a low specific dielectric constant for semiconductor processing, and a method for preparing the coating liquid. The coating liquid is a liquid composition comprising (a) silicon compound obtained by hydrolyzing tetraalkyl orthosilicate (TAOS) and alkoxysilane (AS) in the presence of tetraalkyl ammonium hydroxide (TAAOH) and water, or a silicon compound obtained by hydrolyzing or partially hydrolyzing tetraalkyl orthosilicate (TAOS) in the presence of tetraalkyl ammonium hydroxide (TAAOH) and water, mixing the hydrolyzed or partially hydrolyzed product with alkoxysilane (AS) or a hydrolyzed or partially hydrolyzed product thereof, and hydrolyzing all or a portion of the mixture, (b) an organic solvent, and (c) water. The coating liquid is characterized in that a quantity of water contained in the liquid composition is in the range from 35 to 65% by weight.

16 Claims, 1 Drawing Sheet

COATING LIQUID FOR FORMATION OF PROTECTIVE FILM FOR SEMICONDUCTOR PROCESSING AND METHOD FOR PREPARATION OF THE SAME

TECHNICAL FIELD

The present invention relates to a coating liquid for forming a protective film having high film strength and a low specific dielectric constant for semiconductor processing, a method for producing the coating liquid, and to a protective film for semiconductor processing obtained by applying the coating liquid on a semiconductor substrate or an interlayer insulating film or the like formed on a semiconductor substrate. The term of "protective film" for semiconductor processing as used therein means (1) a CMP (chemical mechanical polishing) sacrifice film used when an interlayer insulating film is chemically or mechanically polished; (2) an etching stopper film and the like used when an interlayer insulating film is etched, and the protective films as described above are sometimes referred to as a "hard mask film" or a "cap mask".

BACKGROUND INVENTION

Recently in association with the progress in the technology for information networking, there are the strong needs for more advanced and sophisticated functions of, lower power consumption in, and size and weight reduction of equipment for information communications, and to satisfy the needs, now it is required to develop semiconductor devices having a higher processing speed and realize a higher degree in circuit integration. Improvement in performance of semiconductor devices has been realized by miniaturization of circuit design, but now device circuits are designed with the dimensions at a submicron level, and the integration degree is higher as compared to that in the past, but the power consumption has disadvantageously increased because of increase in the wiring capacitance, and there occur such problems as wiring delay or cross talk, and therefore further improvement by miniaturization of a circuit design can not be expected. Especially, in a semiconductor device with multilayered wirings designed under a rule of 0.25 microns, a space between metal wires becomes narrower, and therefore impedance in the metal wiring due to electrostatic induction increases, and there are serious concerns about the possibility of delay in response speed and increase in power consumption. To overcome the problems as described above, it is required to minimize a dielectric constant of an interlayer insulating film between a semiconductor substrate and a metal wiring layer such as an aluminum wiring layer or a copper wiring layer or between the metal wiring layers.

The present inventors made strenuous efforts to solve the problems as described above, and found that an amorphous silica-based coating film with high strength and having the specific dielectric constant of 3.0 or below and even 2.5 or below and the Young's modulus of 6.0 GPa or more can be formed by using a coating liquid for forming an amorphous silica-based coating film with a lower dielectric constant containing a silicon compound obtained by hydrolyzing tetraalkyl orthosilicate (TAOS) and specific alkoxysilane (AS) in the presence of tetraalkyl ammonium hydroxide (TAAOH), and made a patent application based on the finding (described in Patent document 1). Furthermore the inventors found, in relation to the invention described above, (1) a method for forming a amorphous silica-based coating film having a low dielectric constant by applying a coating liquid containing the silicon compound on a substrate and thermally processing the coating liquid at the temperature in the range from 80 to 350° C. and then curing the coating liquid at the temperature in the range from 350 to 450° C., and (2) a method for forming an amorphous silica-based coating film by applying a coating liquid containing the silicon compound on a substrate, thermally processing the coating liquid at the temperature in the range from 80 to 350° C., and then irradiating an electron beam for curing the coating liquid, and made a patent application based on the finding (as described in Patent document 2 and Patent document 3).

Now it is possible to form an interlayer insulating film which can satisfy the needs and demands by semiconductor manufacturers as described above, and in association with the techniques newly developed, it is required to provide materials for formation of a protective film for semiconductor processing such as a CMP sacrifice film or an etching stopper film having excellent abrasion resistance as well as a high film strength and a low specific dielectric constant allowing for a high freedom in selection of conditions for etching and furthermore excellent in such properties as adhesiveness, chemical resistance, ashing resistance, plasma resistance, heat resistance, moisture resistance, and stability.

In the conventional technology, as the protective films, generally a silicon dioxide ($SiO_2$) film, a silicon nitrate (SiN) film, a silicon carbide (SiC) film, a silicon carbide nitrogen (SiCN) film and the like are used, and the films are formed by the gas phase growth method based on the plasma CVD (Plasma Chemical Vapor Deposition). The protective films as described above have, however, the defect that the specific dielectric constant is around 3.8 in a case of the silicon dioxide film or 4.0 or more in other films, and the effective dielectric constant of the entire semiconductor substrate becomes disadvantageously higher even when a specific dielectric constant of the interlayer insulating film is 3.0 or below.

In contrast, there has been proposed a method for formation of a protective film for semiconductor processing such as a CMP sacrifice film or an etching stopper film by using a coating liquid containing an organic silicon polymer such as polycarbosilane for the purpose to further lower a specific dielectric constant of the protective film (the so-called coating method) (as described in Patent document 4 and Patent document 5). The protective films formed by using the coating liquid as described above have the specific dielectric constant of 3.0 or more, and the film strength is not always high, and therefore it can not be said that the protective films satisfy the needs of the semiconductor manufacturers.

Patent document 1: JP 2004-149714 A
Patent document 2: JP 2004-153147 A
Patent document 3: Specification of JP Application No. 2004-141749
Patent document 4: JP 2004-186610 A
Patent document 5: JP 2004-186611 A

DISCLOSURE OF THE INVENTION

Problems to be Solved by the Invention

The needs and demands from the semiconductor industries in this technical field have been becoming increasingly higher, and it is required to provide materials for formation of a protective film for semiconductor processing such as a CMP sacrifice film or an etching stopper film having a high film strength of 8.0 GPa or more (preferably 10.0 GPa or more) when expressed by the Young's modulus and a low specific dielectric constant of 3.0 or below as well as excellent properties as adhesiveness, chemical resistance, ashing resistance, plasma resistance, heat resistance, moisture resistance, and stability.

To satisfy the needs, the present inventors repeatedly made keen efforts to develop materials which can satisfy the needs and demands from the semiconductor manufacturers, and found that a desired coating liquid can be obtained by selecting specific ones from the raw materials used for preparation of a coating liquid described in Patent document 1 and developed for formation of an interlayer insulating film having a low dielectric constant and adjusting composition and other parameters of the obtained coating liquid within a specific range, and made the present invention based on the finding.

An object of the present invention is to provide a coating liquid for formation of a protective film for semiconductor processing having a high film strength (Young's modulus of 8.0 GPa or more) and a low specific dielectric constant (in the range from 2.7 to 3.0) and furthermore excellent in such properties as adhesiveness, chemical resistance, ashing resistance, plasma resistance. moisture resistance, stability, and the like, and a method of preparing the coating liquid, and furthermore to provide a protective film for semiconductor processing obtained by applying the coating liquid on an interlayer insulating film formed on a semiconductor substrate.

Means for Solving the Problems

A first coating liquid according to the present invention is used for formation of a protective film for semiconductor processing having high film strength and a low specific dielectric constant, and the coating liquid comprises;
(a) a silicon compound obtained by hydrolyzing tetraalkyl orthosilicate (TAOS) and alkoxysilane (AS) expressed by the following general formula (I) in the presence of tetramethyl ammonium hydroxide (TMAOH) and water, $$X_n Si(OR)_{4-n} \quad (I)$$

(wherein X denotes a hydrogen atom, a fluorine atom, an alkyl group having 1 to 8 carbon atoms, a fluorine-substituted alkyl group, an aryl group, or a vinyl group; and R denotes a hydrogen atom, an alkyl group having 1 to 8 carbon atoms, an aryl group, or a vinyl group; and n is an integer from 1 to 3);
(b) an organic solvent; and
(c) water,
wherein a quantity of water contained in the liquid composition is in the range from 35 to 65% by weight.

A second coating liquid according to the present invention is used for formation of a protective film for semiconductor processing having high film strength and a low specific dielectric constant, and the coating liquid comprises;
(a) a silicon compound obtained by hydrolyzing or partially hydrolyzing tetraalkyl orthosilicate (TAOS) in the presence of tetramethyl ammonium hydroxide (TMAOH) and water, mixing the hydrolyzed or partially hydrolyzed product with alkoxysilane (AS) expressed by the general formula (I) above or a hydrolyzed or partially hydrolyzed product thereof, and further hydrolyzing all or a portion of the resultant mixture;
(b) an organic solvent; and
(c) water,
wherein a quantity of water contained in the liquid composition is in the range from 35 to 65% by weight.

In the coating liquids described above, the tetraalkyl orthosilicate (TAOS) is preferably tetraethyl orthosilicate (TEOS), tetramethyl orthosilicate (TMOS), or a mixture thereof, and the alkoxysilane (AS) is preferably methyltrimethoxysilane (MTMS), methyltriethoxysilane (MTES), or a mixture thereof.

The silicon compound is preferably hydrolysates obtained by hydrolyzing tetraalkyl orthosilicate (TAOS) and alkoxysilane (AS) in the presence of tetrapropyl ammonium hydroxide (TPAOH) in addition to tetramethyl ammonium hydroxide (TMAOH) and water.

The organic solvent preferably contains propylene glycol monomethyl ether (PGME).

A number average molecular weight of the silicon compound is preferably in the range from 10000 to 100000 in terms of polyethylene oxide.

A content of the silicon compound is preferably in a range from 0.1 to 10% by weight against the liquid composition.

A first method for preparing the coating liquid according to the present invention is used for preparing a coating liquid for formation of a protective film for semiconductor processing having high film strength and a low specific dielectric constant, and the method comprises the steps of:
(a) preparing a liquid composition containing a silicon compound by hydrolyzing tetraalkyl orthosilicate (TAOS) and alkoxysilane (AS) expressed by the following general formula (I), which are contained in an organic solvent, in the presence of tetramethyl ammonium hydroxide (TMAOH) and water, $$X_n Si(OR)_{4-n} \quad (I)$$

(wherein X denotes a hydrogen atom, a fluorine atom, an alkyl group having 1 to 8 carbon atoms, a fluorine-substituted alkyl group, an aryl group, or a vinyl group; and R denotes a hydrogen atom, an alkyl group having 1 to 8 carbon atoms, an aryl group, or a vinyl group; and n is an integer from 1 to 3);
(b) substituting at least a portion of an organic solvent contained in the liquid composition obtained in the step (a) above with propylene glycol monomethyl ether (PGME); and
(c) adjusting a quantity of the silicon compound contained in the liquid composition obtained in the step (b) dependent upon a type or an application of a protective film for semiconductor processing to be formed and also adjusting a quantity of water to that in a range from 35 to 65% by weight.

A second method for preparing the coating liquid according to the present invention is used for preparing a coating liquid for formation of a protective film for semiconductor processing having high film strength and a low specific dielectric constant, and the method comprises the steps of:
(a) preparing a liquid composition containing a silicon compound by hydrolyzing or partially hydrolyzing tetraalkyl orthosilicate (TAOS) which is contained in an organic solvent in the presence of tetramethyl ammonium hydroxide (TMAOH) and water, mixing the hydrolyzed or partially hydrolyzed product with alkoxysilane (AS) expressed by the general formula (I) above or a hydrolyzed or partially hydrolyzed product thereof, which is contained in an organic solvent, and further hydrolyzing all or a portion of the resulting mixture;
(b) substituting at least a portion of an organic solvent contained in the liquid composition obtained in the step (a) with propylene glycol monomethyl ether (PGME); and
(c) adjusting a quantity of the silicon compounds contained in the liquid composition obtained in the step (b) dependent upon a type or an application of the protective film for semiconductor processing to be formed and also adjusting a quantity of water to that in the range from 35 to 65% by weight.

In the method for preparing the coating liquids, the organic solvent used in the step (a) is preferably alcohol such as methanol, ethanol, or propanol. The tetraalkyl orthosilicate (TAOS) used in the step (a) above is preferably tetraethyl orthosilicate (TEOS), tetramethyl orthosilicate (TMOS), or a mixture thereof, and the alkoxysilane (AS) used in the step (a) is preferably methyltrimethoxysilane (MTMS), methyltriethoxysilane (MTES), or a mixture thereof.

The liquid composition prepared in the step (a) is preferably used a silicon compound obtained by hydrolyzing the tetraalkyl orthosilicate (TAOS) and the alkoxysilane (AS) in the presence of tetrapropyl ammonium hydroxide (TPAOH) in addition to tetramethyl ammonium hydroxide (TMAOH) and water.

The substitution of solvent in the step (b) is preferably performed with a rotary evaporator.

On the other hand, the protective film for semiconductor processing according to the present invention is preferably formed on a semiconductor substrate by any of the following methods:

(1) a method in which the coating liquid for formation of a protective film for semiconductor processing according to the present invention is applied on a semiconductor substrate, an interlayer insulating film formed on a top of semiconductor substrate or the like, the substrate is heated at the temperature in the range from 80 to 350° C., and is further cured at the temperature in the range from 350 to 450° C.
(2) a method in which the coating liquid for formation of a protective film for semiconductor processing according to the present invention is applied on a semiconductor substrate, an interlayer insulating film formed on a top of a semiconductor substrate or the like, the substrate is heated at the temperature in the range from 80 to 350° C., and is further cured by irradiating an electron beam to the substrate.

Preferably an average diameter of pores in the protective film for semiconductor processing obtained as described above is 3 nm or below, and the pore volume of micropores each having a diameter of less than 2 nm is preferably 75% or more in percentage to the total pore volume. Furthermore, a maximum diameter of pores in the protective film is preferably 10 nm or below, and also an average diameter of mesopores each having a diameter of more than 2 nm is preferably 4 nm or below.

A young's modulus of the protective film is preferably 8.0 GPa or more. In addition, a specific dielectric constant of the protective film is preferably in the range from 2.7 to 3.0.

Preferable application of the protective films includes, for instance, a CMP sacrifice film to be used for polishing an interlayer insulating film chemically and mechanically or an etching stopper film to be used for etching an interlayer insulating film.

EFFECTS OF THE INVENTION

With the coating liquid for formation of a protective film for semiconductor processing according to the present invention, it is possible to form a protective film for semiconductor processing having a high film strength of 8.0 GPa or more and preferably 10.0 GPa or more as expressed by Young's modulus and a low specific dielectric constant of 3.0 or below. More specifically, it is possible to form a protective film in which an average diameter of pores is 2 nm or below and the pore volume of micropores each having a diameter of 3 nm or below is 75% or more in percentage to the total pore volume, and also it is possible to form a protective film in which a maximum diameter of pores is 10 nm or below and an average diameter of mesopores each having a diameter of more than 2 nm is 4 nm or below. In addition, it is possible to form a protective film excellent in such properties as adhesiveness, chemical resistance, ashing resistance, plasma resistance, heat resistance, moisture resistance, and stability.

The protective film obtained from the coating liquid according to the present invention, namely a CMP sacrifice film, an etching stopper film, or the like can sufficiently satisfy the recent demands from semiconductor manufacturers and can be used advantageously.

Furthermore, by using the coating liquid according to the present invention, it is possible to use a facility (such as, for instance, a sheet-feed type hot plate) for formation of an interlayer insulating film by using the coating liquid for formation of an amorphous silica-based coating film having a low dielectric constant described in Patent document 1, and also it is possible to advantageously form a protective film for semiconductor processing by the similar method.

DESCRIPTION OF SIGNS

Figure 1:
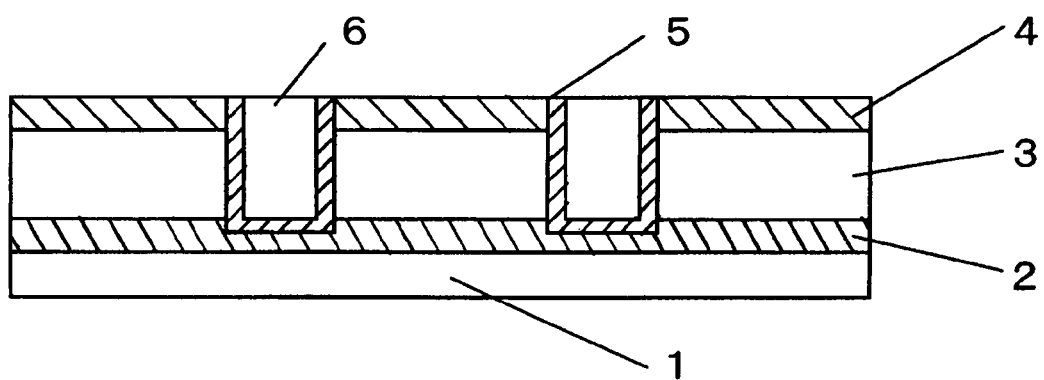
FIG. 1 is a conceptual cross-sectional view illustrating a semiconductor substrate prepared in Example 5. In this FIGURE, an etching stopper film 2 and a CMP sacrifice film 4 are based on the protective film for semiconductor processing according to the present invention.

1. Substrate (silicon wafer)
2. Etching stopper film
3. Interlayer insulating film
4. CMP sacrifice film
5. Barrier metal layer
6. Copper layer (wiring section)

BEST MODE FOR CARRYING OUT THE INVENTION

A coating liquid for formation of a protective film for semiconductor processing and a method of preparing the coating liquid according to the present invention are described in detail below. Furthermore, a protective film for semiconductor processing formed with the coating liquid according to the present invention is described in detail below.

[Coating Liquid for Formation of a Protective Film for Semiconductor Processing]

A first coating liquid (Coating liquid A) according to the present invention is used for formation of a protective film for semiconductor processing having a high film strength and a low specific dielectric constant, and the coating liquid comprises;

(a) a silicon compound obtained by hydrolyzing tetraalkyl orthosilicate (TAOS) and alkoxysilane (AS) expressed by the following general formula (I) in the presence of tetramethyl ammonium hydroxide (TMAOH) and water, $$X_n Si(OR)_{4-n} \qquad (I)$$

(wherein X denotes a hydrogen atom, a fluorine atom, an alkyl group having 1 to 8 carbon atoms, a fluorine-substituted alkyl group, an aryl group, or a vinyl group; and R denotes a hydrogen atom, an alkyl group having 1 to 8 carbon atoms, an aryl group, or a vinyl group; and n is an integer from 1 to 3);
(b) an organic solvent, and
(c) water,
and is characterized in that a quantity of water contained in the liquid composition is in the range from 35 to 65% by weight.

A second coating liquid (Coating liquid B) according to the present invention is used for formation of a protective film for semiconductor processing having a high film strength and a low specific dielectric constant, and the coating liquid comprises;
(a) a silicon compound obtained by hydrolyzing or partially hydrolyzing tetraalkyl orthosilicate (TAOS) in the presence of tetramethyl ammonium hydroxide (TMAOH) and water, mixing the hydrolyzed or partially hydrolyzed product with alkoxysilane (AS) expressed by the general formula (I) above or a hydrolyzed or partially hydrolyzed product thereof, and further hydrolyzing all or a portion of the resultant mixture;
(b) an organic solvent; and
(c) water,
and is characterized in that a quantity of water contained in the liquid composition is in the range from 35 to 65% by weight.

The tetraalkyl orthosilicate (TAOS) includes, for instance, tetramethyl orthosilicate, tetraethyl orthosilicate, tetrapropyl orthosilicate, tetraisopropyl orthosilicate, and tetrabutyl orthosilicate. Of these compounds, the tetraalkyl orthosilicate (TAOS) used in the present invention is preferably tetraethyl orthosilicate (TEOS), tetramethyl orthosilicate (TMOS), or a mixture thereof.

The alkoxysilane (AS) described above includes, for instance, methyl trimethoxysilane, methyl triethoxysilane, methyl triisopropoxysilane, ethyl trimethoxysilane, ethyl triethoxysilane, ethyl triisopropoxysilane; octyl trimethoxysilane, octyl triethoxysilane, vinyl trimethoxysilane, vinyl triethoxysilane, phenyl trimethoxysilane, phenyl triethoxysilane, trimethoxysilane, triethoxysilane, triisopropoxysilane, fluoro-trimethoxysilane, fluoro-triethoxysilane, dimethyl dimethoxysilane, dimethyl diethoxysilane, diethyl dimethoxysilane, diethyl diethoxysilane, dimethoxysilane, diethoxysilane, difluoro dimethoxysilane, difluoro diethoxysilane, trifluoromethyl trimethoxysilane, trifluoromethyl triethoxysilane. Of these compounds, the alkoxysilane (AS) used in the present invention is preferably methyl trimethoxysilane (MTMS), methyl triethoxysilane (MTES), or a mixture thereof.

The silicon compound may be obtained by hydrolyzing the tetraalkyl orthosilicate (TAOS) and the alkoxysilane (AS) in the presence of tetrapropyl ammonium hydroxide (TPAOH) in addition the tetramethyl ammonium hydroxide (TMAOH) and water. In this case, a weight ratio of the tetrapropyl ammonium hydroxide (TPAOH) against the tetramethyl ammonium hydroxide (TMAOH) is preferably 10/10 or below, and more preferably 5/10 or below. When the weight ratio is over 10/10, the specific dielectric constant becomes 2.7 or below, but a film strength of the protective film drops, and consequently a young's modulus required for a protective film for semiconductor processing can hardly be achieved, which is disadvantageous.

The organic solvent, which can be used in the present invention, includes alcohols, glycols, glycol ethers, esters, and the like which are compatible with water and can disperse the silicon compound. Of these compounds, the organic solvent used in the present invention is preferably a solvent containing propylene glycol monomethyl ether (PGME), and more preferably a mixture of alcohols such as methanol, ethanol and propanol, and propylene glycol monomethyl ether (PGME). Especially, a mixture of ethanol and propylene glycol monomethyl ether (PGME) is quite stable when the silicon compound is dispersed therein, and a life of the coating liquid containing the mixture is long, and therefore the mixture is preferably used in the present invention. Furthermore, when the propylene glycol monomethyl ether (PGME) is contained in the mixture, the mixture is effective in lowering a surface tension of the coating liquid.

Furthermore, the water is preferably pure water or ultra pure water not containing ions of impurities.

In the coating liquid according to the present invention, a content of water in the liquid composition is in the range from 35 to 65% by weight, and more preferably in the range from 40 to 60% by weight against the weight of the liquid composition. When the water content is less than 35% by weight, stability of the coating liquid is degraded and the life is shortened. When the water content is over 65% by weight, a surface tension of the coating liquid becomes higher, and the coating liquid is repelled on a coated surface of a silicon wafer or an interlayer insulating film, which makes it impossible to form a homogeneous protective film on the entire coated surface.

A number average molecular weight of the silicon compound is preferably in the range from 10000 to 100000, and more preferably in the range from 20000 to 60000 in terms of polyethylene oxide. When the number average molecular weight is less than 10000, it becomes difficult to form a homogeneous protective film on the entire coated surface, and when the number average molecular weight is over 100000, stability of the coating liquid is degraded.

A content of the silicon compound in the liquid composition is preferably in the range from 0.1 to 10% by weight, and more preferably in the range from 0.5 to 7% by weight. When the content is less than 0.1% by weight, it becomes difficult to form a protective film with a desired film thickness on the entire coated surface. Even when the content is more than 10% by weight, any specific problem does not occur, but sometimes the film thickness is more than that required for a protective film for semiconductor processing. More specifically, in a case of a coating liquid for formation of a CMP sacrifice film, a content of the silicon compound is preferably in a range from 1 to 7% by weight, and in a case of a protective film for formation of an etching stopper film, a content of the silicon compound is preferably in the range from 0.1 to 4% by weight.

Furthermore, the organic solvent is a remaining component (a balance component) constituting the liquid composition, and there is not specific limit to the content, but the content in the composition is preferably in the range from 25 to 64.9% by weight.

[Method for Preparation of a Coating Liquid for Formation of Protective Film for Semiconductor Processing]
[Coating Liquid A]

A method of preparing a first coating liquid for formation of a protective film for semiconductor processing (coating liquid A) according to the present invention is employed for formation of a protective film for semiconductor processing having a high film strength and a low specific dielectric constant, and the method comprises the steps of:
(a) preparing a liquid composition containing a silicon compound by hydrolyzing tetraalkyl orthosilicate (TAOS) and alkoxysilane (AS) expressed by the following general formula (I), which are contained in an organic solvent, in the presence of tetramethyl ammonium hydroxide (TMAOH) and water, $$X_nSi(OR)_{4-n} \tag{I}$$

(wherein X denotes a hydrogen atom, a fluorine atom, an alkyl group having 1 to 8 carbon atoms, a fluorine-substituted alkyl group, an aryl group, or a vinyl group; and R denotes a hydrogen atom, an alkyl group having 1 to 8 carbon atoms, an aryl group, or a vinyl group; and n is an integer from 1 to 3);

(b) substituting at least a portion of an organic solvent contained in the liquid composition obtained in the step (a) above with propylene glycol monomethyl ether (PGME); and (c) adjusting a quantity of the silicon compound contained in the liquid composition obtained in the step (b) dependent upon a type or an application of a protective film for semiconductor processing to be formed and also adjusting a quantity of water to that in a range from 35 to 65% by weight.

The tetraalkyl orthosilicate (TAOS) includes, for instance, tetramethyl orthosilicate, tetraethyl orthosilicate, tetrapropyl orthosilicate, tetraisopropyl orthosilicate, and tetrabutyl orthosilicate. Of these compounds, the tetraalkyl orthosilicate (TAOS) used in the present invention is preferably tetraethyl orthosilicate (TEOS), tetramethyl orthosilicate (TMOS), or a mixture thereof.

The alkoxysilane (AS) described above includes, for instance, methyl trimethoxysilane, methyl triethoxysilane, methyl triisopropoxysilane, ethyl trimethoxysilane, ethyl triethoxysilane, ethyl triisopropoxysilane, octyl trimethoxysilane, octyl triethoxysilane, vinyl trimethoxysilane, vinyl triethoxysilane, phenyl trimethoxysilane, phenyl triethoxysilane, trimethoxysilane, triethoxysilane, triisopropoxysilane, fluoro-trimethoxysilane, fluoro-triethoxysilane, dimethyl dimethoxysilane, dimethyl diethoxysilane, diethyl dimethoxysilane, diethyl diethoxysilane, dimethoxysilane, diethoxysilane, difluoro dimethoxysilane, difluoro diethoxysilane, trifluoromethyl trimethoxysilane, trifluoromethyl triethoxysilane. Of these compounds, the alkoxysilane (AS) used in the present invention is preferably methyl trimethoxysilane (MTMS), methyl triethoxysilane (MTES), or a mixture thereof.

In the method for preparation of a coating liquid for formation of an amorphous silica-based coating film having a low dielectric constant described in Patent document 1 above, tetraalkyl ammonium hydroxide (TAAOH) selected from the group consisting of tetrapropyl ammonium hydroxide (TPAOH), tetrabutyl ammonium hydroxide (TBAOH), and a mixture thereof was used. However, in preparation of the coating liquid for formation of a protective film for semiconductor processing according to the present invention, tetramethyl ammonium hydroxide (TMAOH) is used. This is due to that, when a coating liquid for formation of a protective film for semiconductor processing prepared from the tetramethyl ammonium hydroxide (TMAOH) is used, a protective film for semiconductor processing having a film structure with an extremely low percentage of a mesopores volume can be formed. Because of this feature, with the present invention, it is possible to obtain a protective film for semiconductor processing having high film strength.

As for the tetramethyl ammonium hydroxide (TMAOH), a highly purified product is procurable from the market at present, and it is preferable to use the product.

However, when any impurity including a compound of an alkali metal element such as sodium (Na) or potassium (K) is included more than 50 ppb by weight as each element base, the impurity is diffused in a transistor portion constituting a semiconductor substrate, which may sometimes cause degradation of a transistor. Furthermore, when any impurity including a compound of a halogen element such as bromine (Br) or chlorine (Cl) is contained more than 1 ppm by weight as each element base, aluminum wiring or copper wiring constituting a semiconductor substrate may be corroded, which in turn may leads to a fatal damage to the semiconductor substrate. Furthermore, when impurities including the compound of the alkali metal element are contained more than 50 ppb by weight, in hydrolysis of tetraalkyl orthosilicate (TAOS) and alkoxysilane (AS) expressed by the general formula (I) as described above in the presence of tetraethyl ammonium hydroxide (TMAOH), the impurities function as a catalyst, and provide a silicon compound which is a zeolite-like crystalline silica. As a result, the formed silica-based protective film is crystalline like zeolite, so that a surface of the protective film is irregular, which sometimes makes it impossible to obtain a flat and smooth surface.

When it is impossible to procure a market product of tetramethyl ammonium hydroxide (TMAOH) not containing impurities as described above, it is necessary to reduce a content of the impurities to the levels as described above. Namely, it is necessary to substantially remove, by subjecting the tetramethyl ammonium hydroxide (TMAOH) to processing by a cation-exchange resin and to processing by an anion-exchange resin, the impurities including compounds of alkali metal elements such as sodium (Na) or potassium (K) and compounds of halogen group elements such as bromine (Br) or chloride (Cl) for the purpose to highly purify the tetramethyl ammonium hydroxide (TMAOH).

As described above, in the method for preparation of a coating liquid for formation of protective film for semiconductor processing according to the present invention, tetraethyl ammonium hydroxide (TMAOH) is used, but also tetrapropyl ammonium hydroxide (TPAOH) may be used in the present invention in the state where the compound is added to tetramethyl ammonium hydroxide (TMAOH) at a pre-specified level or below. Namely, the liquid composition prepared in the step (a) above may contain a silicon compound obtained by hydrolyzing the tetraalkyl orthosilicate (TAOS) and the alkoxysilane (AS) in the presence of tetramethyl ammonium hydroxide (TMAOH), tetrapropyl ammonium hydroxide (TPAOH), and water. In this case, a use rate of tetrapropyl ammonium hydroxide (TPAOH) as expressed by a weight ratio against tetramethyl ammonium hydroxide (TMAOH) is preferably 10/10 or below, and more preferably 5/10 or below. When the weight ratio is more than 10/10, the specific dielectric constant drops to 2.7 or below, but also a film strength of the protective film drops, which disadvantageously makes it difficult to achieve the Young's modulus required for a protective film for semiconductor processing.

Also it is necessary to highly purify the tetrapropyl ammonium hydroxide (TPAOH) by substantially removing impurities including compounds of alkali metal elements such as sodium (Na) or potassium (K) and those including halogen group elements such as bromine (Br) or chloride (Cl) like in the case of tetramethyl ammonium hydroxide (TMAOH).

A molar ratio (TAOS/AS) between tetraalkyl orthosilicate (TAOS) and alkoxysilane (AS) used in the present invention is preferably in the range from 6/4 to 2/8, and more preferably in the range from 5/5 to 3/7 in terms of $SiO_2$. When the molar ratio is more than 6/4, hydrophobicity of the obtained silica-based coating film deteriorates. When the molar ratio is less than 2/8, it becomes difficult to obtain a silica-based coating film having sufficient film strength.

Furthermore, a molar ratio (TMAOH/(TAOS+AS)) between tetramethyl ammonium hydroxide (TMAOH) and components for forming silica-based coating film (TAOS+AS), or a molar ratio ((TMAOH+TPAOH)/(TAOS+AS)) between a mixture of tetramethyl ammonium hydroxide (TMAOH) and tetrapropyl ammonium hydroxide (TPAOH), and components for forming silica-based coating film (TAOS+AS) is preferably in the range from 1/10 to 7/10, and more preferably in the range from 1/10 to 6/10 in terms of $SiO_2$ (for TAOS and AS). When the molar ratio is less than 1/10, functions as a template material are insufficient, and the number of pores formed in the protective film (pore volume) becomes smaller, and in this case, it is difficult to obtain a silica-based coating film having a specific dielectric constant of 3.0 or below. When the molar ratio is more than 7/10, the functions as a template material are excessive, so that the number of pores formed in the protective film (pore volume) becomes larger, and it is difficult to obtain a silica-based coating film with the Young's modulus of 8.0 GPa or more (especially 10 GPa or more). Furthermore, when the silica-based coating film is formed on a semiconductor substrate, some of the tetraalkyl ammonium hydroxide (TMAOH, or TMAOH and TPAOH) may remain in the protective film, which may negatively affect functions of the semiconductor.

As the organic solvent used in the step (a) above, there can be enumerated alcohols, ketones, glycols, glycol ethers, esters, and hydrocarbons, and more specifically, there can be enumerated alcohols such as methanol, ethanol, propanol, and butanol; ketones such as methyl ethyl ketone, and methyl isobutyl ketone; glycols such as ethylene glycol, propylene glycol, and hexylene glycol; glycol ethers such as methyl cellosolve, ethyl cellosolve, and propylene glycol monopropyl ether; esters such as methyl acetate, ethyl acetate, methyl lactate, and ethyl lactate; hydrocarbons such as hexane, cyclohexane, and octane; and aromatic hydrocarbons such as toluene, xylene, and mesitylene. Of these compounds, it is especially preferably to use alcohols such as methanol, ethanol, and propanol in the present invention. Especially, since ethanol is safe and is highly dispersible, the use of ethanol is preferable in the present invention.

There is no specific limitation over a use rate of the organic solvent, but a mixing weight ratio (OS/(TAOS+AS)) in weight of the organic solvent (OS) against the components for forming silica-based coating film (TAOS and AS) is preferably in the range from 1/1 to 3/1, and more preferably in the range from 1/1 to 2.5/1.

Next, a method for preparation of the coating liquid for formation of a protective film (Coating liquid A) according to the present invention is described in further details.

Step (a)

The step (a) is preferably performed in the mode as described below. With this step, it is possible to obtain a liquid composition containing silicon compounds which are hydrolysates of the tetraalkyl orthosilicate (TAOS) and the alkoxysilane (AS).

(i) Tetraalkyl orthosilicate (TAOS) and alkoxysilane (AS) expressed by the general formula (I) above are mixed with the organic solvent, and then the mixture is agitated at the temperature of 10 to 30° C. and at a rotational speed of 100 to 200 rpm until the components are fully mixed with each other.

(ii) Then, an aqueous solution of tetramethyl ammonium hydroxide (TMAOH) (or both of tetramethyl ammonium hydroxide (TMAOH) and tetrapropyl ammonium hydroxide (TPAOH)) is dripped in the mixture solution being agitated over 5 to 20 minutes, and the resultant mixture solution is further agitated for 30 to 90 minutes at a temperature in the range from 10 to 30° C. and at a rotational speed of 100 to 200 rpm.

(iii) Then, the mixture solution is heated to the temperature in the range from 30 to 80° C., and is agitated from 1 to 72 hours at the temperature and at the rotational speed of 100 to 200 rpm.

In this case, instead of the dripping method (in which the aqueous solution of tetraalkyl ammonium hydroxide (TAAOH) prepared in (ii) above is dripped in the mixture solution prepared in (i) above containing TAOS, AS and the organic solvent), a mixture solution comprising the tetraalkyl orthosilicate (TAOS), alkoxysilane (AS) and an organic solvent prepared in (i) above may be slowly dripped in an aqueous solution of tetramethyl ammonium hydroxide (TMAOH) prepared in (ii) above (or an aqueous solution of tetramethyl ammonium hydroxide (TMAOH) and tetrapropyl ammonium hydroxide (TPAOH)) over 30 to 90 minutes under the same conditions as those described above.

The tetraalkyl orthosilicate (TAOS), alkoxysilane (AS) and tetramethyl ammonium hydroxide (TMAOH) (or both of tetramethyl ammonium hydroxide (TMAOH) and tetrapropyl ammonium hydroxide (TPAOH)) is mixed with each other or added at the molar ratio as described above.

Furthermore, the aqueous solution of tetramethyl ammonium hydroxide (TMAOH) (or a aqueous solution of tetramethyl ammonium hydroxide (TMAOH) and tetrapropyl ammonium hydroxide (TPAOH)) dripped in the mixture solution above contains tetramethyl ammonium hydroxide (TMAOH) (or both of tetramethyl ammonium hydroxide (TMAOH) and tetrapropyl ammonium hydroxide (TPAOH)) by 5 to 40% by weight, and more preferably by 10 to 30% by weight in pure water or ultrapure water. Since the water contained in the aqueous solution is used for effecting a hydrolysis reaction of tetraalkyl orthosilicate (TAOS) and alkoxysilane (AS), the quantity must be sufficient for hydrolysis reaction. Because the tetramethyl ammonium hydroxide (TMAOH) (or both of tetramethyl ammonium hydroxide (TMAOH) and tetrapropyl ammonium hydroxide (TPAOH)) has a function as a catalyst for promoting the hydrolysis reaction, it is not necessary to add any specific catalyst (such as ammonia) from the outside.

The hydrolysis reaction is preferably performed at a temperature in the range from 30 to 80° C. and more preferably in the range from 35 to 60° C. under agitation for 1 to 72 hours, and more preferably for 10 to 48 hours.

A number average molecular weight of the silicon compound (hydrolysates of TAOS and AS) contained in the liquid composition obtained as described above is preferably in the range from 10000 to 100000 and more preferably in the range from 20000 to 60000 in terms of polyethylene oxide. When the number average molecular weight is less than 10000, it is difficult to form a homogeneous protective film on the entire applied surface, and when the number average molecular weight is more than 100000, stability of the coating liquid deteriorates.

Step (b)

The step (b) is preferably carried out with a rotary evaporator procurable from the market in the following mode. With the step (b), the liquid composition containing the organic solvent used in the step (a) is subjected to a solvent substitution system, and the above organic solvent is substituted with the new organic solvent described above.

(i) The liquid composition obtained in the step (a) is placed in a flask of a rotary evaporator, and furthermore propylene glycol monomethyl ether (PGME) or a mixture solution of propylene glycol monomethyl ether (PGME) and water is added in the flask.

(ii) Then the rotary evaporator is run to rotate the flask at a rotational speed in the range from 30 to 120 rpm and more preferably in the range from 60 to 90 rpm under the conditions for decompression at the temperature in the range from 50 to 90° C. and more preferably in the range from 60 to 80° C. and the pressure in the range from −0.05 to −0.1 MPa and more preferably in the range from −0.08 to −0.1 MPa. With this operation, the organic solvent used in the step (a) (such as ethanol) and water are evaporated, so that the vapor is cooled and discharged to the outside of the system.

(iii) By carrying out the operation in (ii) above for a required period of time, the liquid composition, in which the organic solvent is replaced with propylene glycol monomethyl ether (PGME), is obtained.

Furthermore, it is also possible in the operation of (i) above to perform the solvent substitution by placing only the liquid composition obtained in the step (a) in the flask of the rotary evaporator, performed the operation in (ii) above, having the evaporated organic solvent and water discharged, and then adding propylene glycol monomethyl ether (PGME) or a mixture of the propylene glycol monomethyl ether (PGME) and water. In this case, however, sometimes the silicon compound contained in the liquid composition may be denatured, and therefore caution is required.

In this step (b), the organic solvent or water contained in the liquid composition obtained in the step (a), or alcohols or the like produced as a byproduct through hydrolysis of alkoxysilane (AS) or the like are separated and removed. By carrying out the operation in this step with a rotary evaporator, the solvent substitution as described above can be performed completely, but in the present invention, it is not always necessary to perform the solvent substitution completely.

Step (c)

The step (c) is preferably carried out in the following mode. With the step (c), it is possible to obtain a liquid composition containing silicon compounds by adjusting a content of silicon compounds contained in the liquid composition obtained in the step (b) dependent upon a type or an application of a protective film for a semiconductor processing, and also adjusting the water content to that in the range from 35 to 65% by weight.

(i) Composition of the liquid composition obtained in the step (b) above is measured.

(ii) Then, pure water or ultrapure water, or an aqueous solution of propylene glycol monomethyl ether (PGME) is added with agitation, and a quantity of the silicon compound contained in the liquid composition is adjusted dependent upon a type or an application of a protective film for a semiconductor processing to be formed, and also a quantity of water is adjusted.

As described above, a quantity of water contained in the liquid composition is adjusted preferably to that in the range from 35 to 65% by weight, and more preferably to that in the range from 40 to 60% by weight. When the water content is less than 35% by weight, stability of the coating liquid is low, so that the life is short. When the content is over 65% by weight, a surface tension of the coating liquid increases, and the coating liquid is repelled on an applied surface of a silicon wafer or an inter-layer insulating film, and as a result, a homogeneous coating film can not be formed on the entire applied surface.

Furthermore, it is preferable to adjust a content of the silicon compound against the liquid composition to that in the range from 0.1 to 10% by weight, and more preferably to that in the range from 0.5 to 7% by weight. When the contents are less than 0.1% by weight, it is difficult to form a coating film with a desired film thickness on the entire coated surface. When the content is over 10% by weight, no specific problems occur in formation of a coating film, but sometimes the film thickness may be over that required for a protective film for semiconductor processing. More specifically, when a coating liquid for formation of a CMP sacrifice film, a content of the silicon compound is preferably in the range from 1 to 7% by weight, and when a coating liquid for formation of an etching stopper film, a content of the silicon compound is preferably in the range from 0.1 to 4% by weight.

The organic solvent is a remaining component (a balance component) constituting the liquid composition, and there is not specific restriction over the content, but the content in the liquid composition is preferably in the range from 25 to 64.9% by weight. The content of an organic solvent as used herein means a total content of the organic solvent used for solvent substitution in the step (b) and the organic solvent used in the step (a) not substituted and remaining therein.

With the operations as described above, it is possible to obtain a coating liquid A for formation of a protective film for semiconductor processing having a high film strength and a low specific dielectric constant.

[Coating Liquid B]

A method of preparing a second coating liquid for formation of a protective film for semiconductor processing (Coating liquid B) according to the present invention is employed for formation of a protective film for semiconductor processing having high film strength and a low specific dielectric constant, and the method comprises the steps of:

(a) preparing a liquid composition containing a silicon compound by hydrolyzing or partially hydrolyzing tetraalkyl orthosilicate (TAOS) which is contained in an organic solvent in the presence of tetramethyl ammonium hydroxide (TMAOH) and water, then mixing the hydrolyzed or partially hydrolyzed product with alkoxysilane (AS) expressed by the above general formula (I) or a hydrolyzed or partially hydrolyzed product thereof, which is contained in an organic solvent, and further hydrolyzing or partially hydrolyzing all or a portion of the resultant mixture;

(b) substituting at least a portion of an organic solvent contained in the liquid composition obtained in the step (a) with propylene glycol monomethyl ether (PGME); and (c) adjusting a quantity of the silicon composition contained in the liquid composition obtained in the step (b) dependent upon a type or an application of the protective film for semiconductor processing to be formed and also adjusting a quantity of water to that in the range from 35 to 65% by weight.

In the steps above, the tetraalkyl orthosilicate (TAOS), alkoxysilane (AS) and tetraalkyl ammonium hydroxide (TAAOH) may be the same as those used for preparation of the coating liquid A.

As for the tetraalkyl ammonium hydroxide (TAAOH), like in the case of the coating liquid A, it is necessary to substantially remove impurities including compounds of alkali metal elements such as sodium (Na) or potassium (K) and compounds of halogen group elements such as bromine (Br) or chlorine (Cl) by subjecting tetraalkyl ammonium hydroxide procurable from the market to processing with cation-exchange resin and anion-exchange resin. Namely, it is necessary to lower contents of compounds of alkali metal elements such as sodium (Na) or potassium (K) to 50 ppb by weight or below as each element base and also to lower contents of compounds of halogen group elements such as bromine (Br) or chlorine (Cl) to 1 ppm by weight or below as each element base.

Preparation of the liquid composition (coating liquid B) is carried out by hydrolyzing or partially hydrolyzing tetraalkyl orthosilicate (TAOS) in the presence of tetraalkyl ammonium hydroxide (TAAOH) and water, mixing alkoxysilane (AS), or hydrolyzed or partially hydrolyzed products thereof, and further hydrolyzing all or a portion of the resultant mixture.

When alkoxysilane (AS) is previously hydrolyzed (or partially hydrolyzed) and then mixed, the hydrolysis is preferably performed in the presence of tetramethyl ammonium hydroxide (TMAOH) or a mixture of tetramethyl ammonium hydroxide (TMAOH) and tetrapropyl ammonium hydroxide (TPAOH), like when hydrolyzing (or partially hydrolyzing) tetraalkyl orthosilicate (TAOS).

As described above, also in preparation of the liquid composition (Coating liquid B), tetramethyl ammonium hydroxide (TMAOH) is used like in preparation of the coating liquid A, but tetrapropyl ammonium hydroxide (TPAOH) may be used in addition to tetramethyl ammonium hydroxide (TMAOH) on the condition that the content is not more than a pre-specified value. In other words, the liquid composition prepared in the step (a) may contain the silicon compound obtained by hydrolyzing the tetraalkyl orthosilicate (TAOS) and the alkoxysilane (AS) in the presence of tetramethyl ammonium hydroxide (TMAOH), tetrapropyl ammonium hydroxide (TPAOH) and water. In this case, a use rate of the tetrapropyl ammonium hydroxide (TPAOH) against tetramethyl ammonium hydroxide (TMAOH) in term of the weight ratio is preferably 10/10 or below, and more preferably 5/10 or below. When the weight ratio is over 10/10, the specific dielectric constant becomes 2.7 or below, but also a film strength of the coating film becomes lower, which disadvantageously makes it difficult to achieve the Young's modulus required to a protecting film for semiconductor processing.

Also for tetrapropyl ammonium hydroxide (TPAOH), like in the case of the tetrapropyl ammonium hydroxide (TPAOH), it is necessary to substantially remove impurities containing compounds of alkali metal elements such as sodium (Na) or potassium (K) and compounds of halogen group elements such as bromine (Br) or chlorine (Cl) contained in the tetrapropyl ammonium hydroxide (TPAOH)).

When tetramethyl ammonium hydroxide (TMAOH) or a mixture of tetramethyl ammonium hydroxide (TMAOH) and tetrapropyl ammonium hydroxide (TPAOH)) is used for preparation of this liquid composition (Coating liquid B), like in the case of the coating liquid A, the molar ratio (TMAOH/TAOS or TMAOH/AS)) of tetramethyl ammonium hydroxide (TMAOH) against the component for forming silica-based coating film, namely against tetraalkyl orthosilicate (TAOS) or alkoxysilane (AS), or the molar ratio ((TMAOH+TPAOH)/TAOS or (TPAOH+TPAOH)/AS) of tetramethyl ammonium hydroxide (TMAOH) and tetrapropyl ammonium hydroxide (TPAOH) against the component for forming silica-based coating film (namely, TAOS or AS) is preferably in the range from 1/10 to 7/10, and more preferably in the range from 1/10 to 6/10 in terms of $SiO_2$ (for TAOS and AS). Therefore, the molar ratio (TMAOH/(TAOS+AS) or ((TMAOH+TPAOH)/(TAOS+AS)) of the tetramethyl ammonium hydroxide (TMAOH) or a mixture of tetramethyl ammonium hydroxide (TMAOH) and tetrapropyl ammonium hydroxide (TPAOH) against the components for forming the silica-based coating film (TAOS and AS) is, like in the coating liquid A, preferably in the range from 1/10 to 7/10, and more preferably in 1/10 to 6/10 in terms of $SiO_2$ (for TAOS and AS).

When mixing the components, like in preparation of the coating liquid A, the molar ratio (TAOS/AS) of tetraalkyl orthosilicate (TAOS) to alkoxysilane (AS) is preferably in the range from 6/4 to 2/8, and more preferably in the range 5/5 to 3/7 in terms of $SiO_2$.

The method of preparing the coating liquid for formation of a coating film (Coating liquid B) according to the present invention is described in further details.

Step (a)

The step (a) is preferably carried out in the following mode. With this step, a liquid composition containing silicon compounds which are hydrolysates of the tetraalkyl orthosilicate (TAOS) and the alkoxysilane (AS) can be obtained. The mode is divided into the "method (1) for preparing silicon compounds" and "method (2) for preparing silicon compounds" as described below.

Method (1) for Preparing Silicon Compounds (i) Tetraalkyl orthosilicate (TAOS) is mixed with an organic solvent, and the mixture is agitated at the temperature of 10 to 30° C. and at the rotational speed of 100 to 200 rpm until the components are fully mixed with each other.

(ii) Then, an aqueous solution of tetramethyl ammonium hydroxide (TMAOH) (or both of tetramethyl ammonium hydroxide (TMAOH) and tetrapropyl ammonium hydroxide (TPAOH)) is dripped in the mixture solution being agitated over 5 to 20 minutes, and the resultant mixture solution is agitated for 30 to 90 minutes at the temperature of 10 to 30° C. and at the rotational speed of 100 to 200 rpm.

(iii) Then, the mixture solution is heated to the temperature of 30 to 80° C., and is agitated for 0.5 to 72 hours at the same temperature and at the rotational speed of 100 to 200 rpm to prepare a mixture solution containing a hydrolyzed product or a partially hydrolyzed product of tetraalkyl orthosilicate (TAOS).

(iv) Furthermore, after alkoxysilane (AS) expressed by the general formula (I) above or a mixture of alkoxysilane (AS) and an organic solvent is mixed in the mixture solution obtained in (iii) above, and the mixture solution is agitated at the temperature of 10 to 30° C. and at the rotational speed of 100 to 200 rpm until the components are fully mixed with each other.

(v) Then, an aqueous solution of tetramethyl ammonium hydroxide (TMAOH) (or both of tetramethyl ammonium hydroxide (TMAOH) and tetrapropyl ammonium hydroxide (TPAOH)) is dripped in the mixture solution being agitated over 5 to 20 minutes, and the mixture solution is further agitated for 30 to 90 minutes at a temperature of 10 to 30° C. and at the rotational speed of 100 to 200 rpm.

(vi) Then, the mixture solution obtained in (v) above is heated to the temperature of 30 to 80° C., and is further agitated for 10 to 30 hours at the temperature and at the rotational speed of 100 to 200 rpm.

In this step, instead of the dripping method described above (namely the method in which the aqueous solution of tetraalkyl ammonium hydroxide (TAAOH) prepared in (ii) above is dripped in the mixture solution of tetraalkyl orthosilicate (TAOS) and an organic solvent prepared in (i) above), a mixture solution of the tetraalkyl orthosilicate (TAOS) and the organic solvent prepared in (i) above may be slowly dripped in the aqueous solution of tetramethyl ammonium hydroxide (TMAOH) (or both of the tetramethyl ammonium hydroxide (TMAOH) and tetrapropyl ammonium hydroxide (TPAOH)) prepared in (ii) above over 30 to 90 minutes under the same conditions as those described above (at the temperature of 10 to 30° C. and at the rotational speed of 100 to 200 rpm).

Method (2) for Preparing Silicon Compounds (i) Tetraalkyl orthosilicate (TAOS) is mixed with an organic solvent, and the mixture is agitated at the temperature of 10 to 30° C. and at the rotational speed of 100 to 200 rpm until the components are fully mixed with each other.

(ii) Then an aqueous solution of tetramethyl ammonium hydroxide (TMAOH) (or both of tetramethyl ammonium hydroxide (TMAOH) and tetrapropyl ammonium hydroxide (TPAOH)) is dripped in the mixture solution being agitated over 5 to 20 minutes, and the resultant mixture solution is agitated for 30 to 90 minutes at the temperature of 10 to 30° C. and at the rotational speed of 100 to 200 rpm.

(iii) Then the mixture solution is heated to the temperature of 30 to 80° C., and is agitated for 0.5 to 72 hours at the temperature and at the rotational speed of 100 to 200 rpm to prepare a mixture solution containing a hydrolyzed product or a partially hydrolyzed product of tetraalkyl orthosilicate (TAOS).

(iv) Furthermore, after alkoxysilane (AS) expressed by the general formula (I) above is mixed, and the resultant mixture solution is agitated at the temperature from 10 to 30° C. and at the rotational speed of 100 to 200 rpm until the components are fully mixed with each other.

(v) Then, an aqueous solution of tetramethyl ammonium hydroxide (TMAOH) (or both of tetramethyl ammonium hydroxide (TMAOH) and tetrapropyl ammonium hydroxide (TPAOH)) is dripped in the mixture solution under agitation over 50 to 20 minutes, and the resultant mixture solution is agitated for 30 to 90 minutes at the temperature of 10 to 30° C. and at the rotational speed of 100 to 200 rpm.

(vi) Then, the mixture solution is heated to the temperature of 30 to 80° C., and is agitated for 0.5 to 72 hours at the temperature and at the rotational speed of 100 to 200 rpm to prepare a mixture solution containing a hydrolyzed product or a partially hydrolyzed product of alkoxysilane (AS).

(vii) Then, the mixture solution obtained in (iii) above and the mixture solution obtained in (vi) above are mixed, and the resultant mixture solution is agitated at the temperature of 10 to 30° C. and at the rotational speed of 100 to 200 rpm until the components are fully mixed with each other.

(viii) Furthermore, the solution obtained in (vii) above is heated, if necessary, to the temperature of 30 to 80° C., and is agitated for 10 to 30 hours at the temperature and at the rotational speed of 100 to 200 rpm.

In this case, instead of the dripping method as described above (namely the method in which the aqueous solution of tetramethyl ammonium hydroxide (TMAOH) prepared in (ii) above is dripped in the mixture solution of tetraalkyl orthosilicate (TAOS) and an organic solvent prepared in (i) above and also the aqueous solution of tetramethyl ammonium hydroxide (TMAOH) prepared in (v) above is dripped in the mixture solution of the alkoxysilane (AS) and the organic solvent prepared in (iv) above), another method may be employed in which the mixture solution of tetraalkyl orthosilicate (TAOS) and an organic solvent prepared in (i) above is dripped slowly over 30 to 90 minutes in an aqueous solution of tetramethyl ammonium hydroxide (TMAOH) prepared in (ii) above (or an aqueous solution of tetramethyl ammonium hydroxide (TMAOH) and tetrapropyl ammonium hydroxide (TPAOH)) slowly over 30 to 90 minutes under the same conditions (at the temperature of 10 to 30° C. and at the rotational speed of 100 to 200 rpm), and furthermore the mixture solution of alkoxysilane (AS) and an organic solvent prepared in (iv) above is slowly dripped in an aqueous solution of tetramethyl ammonium hydroxide (TMAOH) prepared in (V) above (or an aqueous solution of tetramethyl ammonium hydroxide (TMAOH) and tetrapropyl ammonium hydroxide (TPAOH)) over 30 to 90 minutes under the same conditions (at the temperature of 10 to 30° C. and at the rotational speed of 100 to 200 rpm).

In this step described above, tetraalkyl orthosilicate (TAOS), alkoxysilane (AS), and tetramethyl ammonium hydroxide (TMAOH) (or both of tetramethyl ammonium hydroxide (TMAOH) and tetrapropyl ammonium hydroxide (TPAOH)) are mixed or added at the molar ratios as described above.

As the organic solvent used in this step, the same one as that used for preparing the coating liquid A may be used. The organic solvents mixed in tetraalkyl orthosilicate (TAOS) and alkoxysilane (AS) may be different when types are the same (such as alcohols), but preferably the solvents are of the same.

There is no specific restriction over a quantity of used organic solvent, but like in the case of the coating liquid A, the mixing weight ratio (OS/(TAOS+AS)) of the organic solvent (OS) against the components for forming silica-based coating film (TAOS and AS) is preferably in the range 1/1 to 3/1, and more preferably in the range from 1/1 to 2.5/1. Therefore, after the mixing, the weight ratio of the organic solvent against the components for forming silica-based coating film (TAOS and AS) becomes, like in the case of the coating liquid A, preferably in the range from 1/1 to 3/1, and more preferably in the range from 1/1 to 2.5/1.

The aqueous solution of tetramethyl ammonium hydroxide (TMAOH) (or an aqueous solution of tetramethyl ammonium hydroxide (TMAOH) and tetrapropyl ammonium hydroxide (TPAOH)) dripped in the mixture organic solvent described above contains tetramethyl ammonium hydroxide (TMAOH) (or both of tetramethyl ammonium hydroxide (TMAOH) and tetrapropyl ammonium hydroxide (TPAOH)) in pure water or ultra pure water, preferably by 5 to 40% by weight and more preferably by 10 to 30% by weight, like in the case of the coating liquid A The hydrolysis described above is carried out, like in the case of the coating liquid A, preferably at the temperature of 30 to 80° C. and more preferably at the temperature of 35 to 60° C. with agitation for 0.5 to 72 hours and more preferably for 10 to 48 hours. In the methods (1) and (2) for preparing the silicon compounds, the time for hydrolyzing each of tetraalkyl orthosilicate (TAOS) or alkoxysilane (AS) independently may be short, but in the next step the hydrolysis reaction is preferably performed (for instance, spending 10 to 30 hours) until the components are completely hydrolyzed.

The number average molecular weight of the silicon compounds (hydrolysates of TAOS and AS) contained in the liquid composition obtained as described above is preferably in the range from 10000 to 100000, and more preferably in the range from 20000 to 60000 in terms of polyethylene oxide.

Step (b)

The step (b) is preferably carried out in the following mode like in the case of the coating liquid A. With this step, it is possible to obtain a liquid composition containing silicon compounds in which the organic solvent used in the step (a) has been substituted with the new organic solvent described above.

(i) The liquid composition obtained in the step (a) is put in a flask of a rotary evaporator, and also propylene glycol monomethyl ether (PGME) or a mixture of propylene glycol monomethyl ether (PGME) and water is added in the flask.

(ii) Then the rotary evaporator is run to rotate the flask preferably at the temperature of 50 to 90° C. and more preferably at the temperature of 60 to 80° C. in the decompressed state of −0.05 to −0.1 MPa and more preferably of −0.08 to −0.1 MPa at the rotational speed of 30 to 120 rpm, and more preferably of 60 to 90 rpm. Then, the organic solvent (such as ethanol) and water used in the step (a) are evaporated, and the vapor is cooled and discharged to the outside of the system.

(iii) By carrying out the operation in (ii) above for a required period of time, it is possible to obtain a liquid composition in which the organic solvent has been substituted with propylene glycol monomethyl ether (PGME).

In the operation of (i) above, also a method is allowable in which only the liquid composition obtained in the step (a) is put in a flask of the rotary evaporator, the operation in (ii) above is carried out; the evaporated organic solvent and water are discharged to the outside; and then propylene glycol monomethyl ether (PGME) or a mixture solution of propylene glycol monomethyl ether (PGME) and water is added for solvent substitution. In this case, however, the silicon compounds contained in the liquid compound may denature, so that caution is required.

In the step (b), like in the case of the coating liquid A, the organic solvent or water, and furthermore alcohols and the like produced each as a byproduct of hydrolysis of alkoxysilane (AS) contained in the liquid composition obtained in the step (a) are removed and separated. By performed the operations in this step with a rotary evaporator, the solvent substitution described above can be carried out almost completely, but it is not always required to carry out the operations completely.

Step (c)

The step (c) is preferably performed, like in the case of the coating liquid A, in the following mode. With this step, it is possible to obtain a liquid composition containing silicon compounds in which the content of silicon compounds contained in the liquid composition obtained in the step (b) has been adjusted dependent upon a type or an application of a protective film for semiconductor processing to be formed, and also the content of water has been adjusted to that in the range from 35 to 65% by weight.

(i) Composition of the liquid composition obtained in the step (b) is measured.

(ii) Then, pure water, ultrapure water, or an aqueous solution of propylene glycol monomethyl ether (PGME) is added in the liquid composition, and the contents of silicon compounds and water contained in the liquid composition are adjusted dependent upon a type or an application of the protective film for semiconductor processing to be formed, like in the case of Coating liquid A.

As described above, the content of the water contained in the liquid composition is adjusted, like in the case of the coating liquid A, preferably to that in the range of 35 to 65%, and more preferably to that in the range from 40 to 60% by weight against the liquid composition.

Furthermore, the content of the silicon compounds is adjusted, like in the case of the liquid composition A, preferably to that in the range from 0.1 to 10%, and more preferably to that in the range from 0.5 to 7% by weight. More specifically, when a coating liquid for formation of a CPM sacrifice film, the content of the silicon compound is preferably in the range from 1 to 7% by weight, and when a coating liquid for formation of an etching stopper film is prepared, the content of the silicon compounds is preferably in the range from 0.1 to 4% by weight.

The organic solvent is, like in the case of the coating liquid A, a remaining component (a balance component) constituting the liquid composition, and there is not specific restriction over the content, but the content is preferably in the range from 25 to 64.9% by weight against the liquid composition.

With this step, it is possible to obtain a coating liquid B for formation of a protective film for semiconductor processing having a high film strength and a low specific dielectric constant.

[Formation of a Protective Film for Semiconductor Processing]

The following methods are available for forming the protective film for semiconductor processing.

(1) A method in which the coating liquid for formation of a protective film for semiconductor processing is applied on a top of a semiconductor substrate, an interlayer insulating film formed on a semiconductor substrate or the like, then the substrate is thermally processed at the temperature in the range from 80 to 350° C., and then is cured at the temperature in the range from 350 to 450° C. (Coating film formation method A).

(2) A method in which the coating liquid for formation of a protective film for semiconductor processing is applied on a top of a semiconductor substrate, an interlayer insulating film formed on a semiconductor substrate or the like, then the substrate is thermally processed at the temperature in the range from 80 to 350° C., and then is cured by irradiating an electron beam to the substrate (Coating film formation method B).

The coating film formation methods are described in detail below.

[Coating Film Formation Method A]

Coating Process

Generally, for applying a coating liquid for formation of a coating film, coating methods such as spin coat method, dip coat method, roll coat method, and transfer method are employed, and also in the present invention any of the known methods as described above can be employed for applying a coating liquid for formation of a protective film for semiconductor processing. Of the methods as described above, the spin coat method is preferable for coating a coating method for formation of a coating film on a semiconductor substrate, and the spin coat method is excellent because the method provides films with homogeneous film thickness and generates dusts little. Therefore, it is preferable to employ the spin coat method for applying a coating liquid, but the transfer method or other appropriate methods may be employed when a coating liquid is applied on a semiconductor substrate with a large size or the like.

The expression of "applying a coating liquid on a semiconductor substrate" as used herein means not only that the coating liquid is directly applied on a semiconductor substrate such as a silicon wafer, but also that the coating liquid is applied on an interlayer insulating film or on other films formed on the semiconductor substrate.

Heating Process

The coating film applied on a semiconductor substrate as described above is heated at the temperature from 80 to 350° C.

When the heat treatment is carried out at the temperature of 350° C. or more, the organic solvent contained in the applied coating film evaporates rapidly, and sometimes pores or voids each with a relatively larger diameter are formed in the coating film, which in turn lowers strength of the coating film. Therefore, in the heat treatment, it is preferable to rise the temperature step by step to the temperature in the range of 80 to 350° C. For instance, heating is performed for one minute at the temperature of 150° C., for one minute at the temperature of 250° C., and furthermore for one minute at the temperature of 350° C. When the heat treatment is performed at the temperature of less than 80° C., the organic solvent contained in the coating film little evaporates and remains in the coating film in most cases, so that an object of the heat treatment is not achieved and sometimes a thickness of the formed coating film is not homogeneous.

A period of time required for the heat treatment varies dependent upon a thickness of a coating film, and the heat treatment is preferably carried out for 1 to 10 minutes and more preferably for 2 to 5 minutes.

Furthermore, the heat treatment may be carried out in the atmosphere of a nitrogen gas as an inert gas or air. Because this treatment is carried out at a relatively low temperature of 350° C. or below and for a short period of time, even when the heat treatment is carried out in the atmospheric air containing a relatively large quantity of oxygen, there occurs no damage such as oxidation to metal wirings provided on a semiconductor substrate. Furthermore, the possibility that a small quantity of oxygen is introduced into the coating film becomes higher, which leads to generation of a silica-based coating film including a high degree of bridging based on the Si—O—Si bond in the curing process as described below, and therefore it becomes easier to form a protective film for semiconductor processing having a moisture resistance (hydrophobicity) and a high film strength.

When the heat treatment is carried out as described above, the organic solvent contained in the applied coating film evaporates, and tetramethyl ammonium hydroxide (TMAOH) (or both of tetramethyl ammonium hydroxide (TMAOH) and tetrapropyl ammonium hydroxide (TPAOH)) contained in the coating film is decomposed and desorbed out of the film. On the other hand, a degree of polymerization between components for forming silica-based coating film as solid components advances to cause curing, and at the same time, melting viscosity of the polymerized material becomes lower during the heat treatment, so that the reflow property of the coating film increases and flatness of the surface of the obtained coating film is improved. The heat treatment is preferably carried out by placing the substrate obtained in the coating process on a sheet-feed type hot plate.

Curing Process

Then the coating film having been subjected to the heat treatment is cured in the atmosphere of an inert gas and at the temperature of 350 to 450° C.

As the inert gas, preferably a nitrogen gas is used, and if necessary, the inert gas may be used together with a small quantity of oxygen by adding an oxygen gas or air (for instance, by around 500 to 10000 ppm by volume). (Refer to WO 01/48806 A1).

The temperature for curing varies dependent upon a type and a quantity of tetramethyl ammonium hydroxide (TMAOH) (or tetramethyl ammonium hydroxide (TMAOH) and tetrapropyl ammonium hydroxide (TPAOH)) used for preparing the coating liquid for formation of a coating film, composition of the coating liquid, a type of a protective film to be formed (such as a CMP sacrifice film or an etching stopper film), but it is desirable to select the temperature in the range from 350 to 450° C. for obtaining a protective film having a high film strength and a low specific dielectric constant.

When the temperature employed in the curing process is less than 350° C., bridging hardly occurs in a precursor of components for forming a silica-based coating film, so that a coating film having a sufficient strength can not be obtained. When the temperature employed in the curing process is over 450° C., sometimes the aluminum wiring or copper wiring constituting the semiconductor substrate may be oxidized or fused, which may give fatal damages to the wiring layer.

A period of time required for the curing process varies dependent upon composition of a coating liquid used for formation of a coating film, a type of a protective film to be formed (such as a CMP sacrifice film, an etching stopper film or the like), a thickness of the coating film or other factors, but preferably the curing process is performed for 5 to 90 minutes, and more preferably for 10 to 60 minutes.

Furthermore, it is preferable to carry out this curing process, like in the case of the heat treatment, by placing a substrate on a sheet-feed type hotplate.

A thickness of a protective film for semiconductor processing obtained as described above varies dependent upon a type of the protective film to be formed, and the film thickness is preferably in the range from 50 to 200 nm for a CMP sacrifice film, and preferably in the range from 20 to 100 nm for an etching stopper film.

[Coating Film Formation Method B]

Coating Process

The coating liquid according to the present invention is applied, like in the coating film formation method A, on a substrate.

Heating Process

The coating film applied on the substrate as described above is heated at the temperature from 80 to 350° C., like in the coating film formation method A.

Curing Process

The coating film having been subjected to the heating process as described above is then cured by irradiating an electron beam to the coating film in the atmosphere of an inert gas.

The irradiated electron beam preferably has an acceleration voltage in the range from 10 to 26 kV. When the acceleration voltage is over 26 kV, damages to a silicon substrate (a silicon wafer), a silica-based coating film formed thereon, or the like become serious, and furthermore a specific dielectric constant of the coating film may become higher than a desired value (3.0 or below). When the acceleration voltage is less than 10 kV, sometimes it is difficult to obtain a silica-based coating film having desired film strength (for instance, with a Young's modulus of 10 GPa or more).

An irradiation dose of the electron beams is preferably in the range from 50 to 1000 $\mu C/cm^2$, and more preferably in the range from 300 to 600 $\mu C/cm^2$. When the irradiation dose is over 1000 $\mu C/cm^2$, sometimes a specific dielectric constant of the formed silica-based coating film is higher than a desired value (3.0 or below). When the irradiation dose is below 50 $\mu C/cm^2$, sometimes a silica-based coating film having a desired film strength (for instance, with a Young's modulus of 10 GPa or more) can not be obtained.

Irradiation of the electron beam is preferably carried out in the atmosphere of a nitrogen gas as an inert gas heated to the temperature preferably in the range from 280 to 410° C. and more preferably in the range from 300 to 400° C. When the temperature is over 410° C., the aluminum wiring or copper wiring constituting the semiconductor substrate may be oxidized or fused, which may give fatal damages to the wiring layer. When the temperature is less than 280° C., bridging hardly occurs in a precursor of the components for forming silica-based coating film, and sometimes a coating film having a sufficient strength can not be obtained.

Furthermore, a period of time required for the curing process varies dependent upon a type of a coating liquid for formation of a coating film or a thickness of the coating film, but generally the curing processing is preferably carried out over 5 to 90 minutes, and more preferably over 10 to 60 minutes. Furthermore, this curing processing is preferably carried out by placing a substrate on a sheet-feed type hot plate, like in the heating process.

A thickness of the protective film for semiconductor processing obtained as described above varies dependent upon, for instance, a type of the protective film to be formed, and the thickness is preferably in the range from 50 to 200 nm for a CMP sacrifice film, and preferably in the range from 20 to 100 nm for an etching stopper film.

[Protective Film for Semiconductor Processing]

The protective film for semiconductor processing according to the present invention can be obtained by the coating film formation method as described above, and has a high film strength of 8.0 GPa or more, particularly 10.0 GPa or more when expressed with the Young's modulus, and a specific dielectric constant of 3.0 or below, more specifically, being in the range from 2.7 to 3.0.

Namely, with the coating liquid for formation of a protective film for semiconductor processing, it is possible to form a coating film having pores in which an average diameter of the pores is 3 nm or below and the pore volume of micropores each having a diameter of 2 nm or below is 75% or more in percentage to the total pore volume, and also it is possible to form a coating film in which the maximum pore diameter of the pores is 10 nm or below and an average diameter of mesopores each having a diameter of more than 2 nm is 4 nm or below. Because of the features, it is possible to obtain a protective film for semiconductor processing having the characteristics as described above.

Other characteristics and features of the protective film for semiconductor processing according to the present invention are as described below.

(1) The protective film has a smooth surface with the surface roughness (Rms) of 1 nm or below. (This surface roughness is expressed by a square average of values measured with an atomic force microscope (AMF)). The protective film is an amorphous silica-based coating film not having an X-ray diffraction peak as measured in the MFI crystal structure of a zeolite coating film.
(2) The protective film itself is excellent in moisture resistance (hydrophobicity), and therefore, even when the protective film is left in the atmospheric air containing saturated water vapor, different from a zeolite coating film, the specific dielectric constant does not deteriorate (Namely the specific dielectric constant does not increase).
(3) The protective film is excellent in adhesion to the surface of a coating film such as an inter-layer insulating film, chemical resistance such as alkali resistance or cracking resistance, and also is excellent in ashing resistance during the resist processing or plasma resistance (heat resistance) during formation of via holes.

As described above, the present invention can provide a protective film for semiconductor processing such as a CMP sacrifice film or an etching stopper film, which can satisfy the recent requirements of semiconductor manufacturers.

The present invention is described in detail below with reference to the examples, but the present invention is not limited to the examples.

EXAMPLE 1

Tetraethyl orthosilicate (TEOS, produced by Tama Chemicals Co. Ltd.), methyl trimethoxysilane (MTMS, produced by Shin-Etsu Chemical Co., Ltd), and ethanol with the concentration of 99.5% by weight (ETOH, Wako Pure Chemical Industries, Ltd.) were mixed at the mixing ratios as shown in Table 1, and the mixture solution was kept at the temperature of 20° C. and agitated for 30 minutes at the rotational speed of 150 rpm.

An aqueous solution of tetramethyl ammonium hydroxide (TMAOH, produced by Tama Chemicals CO. Ltd.) was dripped in the mixture solution over 10 minutes, and furthermore the resultant mixture solution was agitated for one hour at the temperature of 20° C. and at the rotational speed of 200 rpm. Then the mixture solution was heated up to the temperature of 50° C., and agitated without changing the temperature for 20 hours at the rotational speed of 200 rpm to hydrolyze components for forming silica-based coating film (TEOS and MTMS). Contents of impurities used in tetramethyl ammonium hydroxide (TMAOH) used in this process were 10 ppb by weight or below (which is a lower limit for detection) for sodium, 10 ppb by weight or below (which is a lower limit for detection) for potassium, 1 ppm by weight or below for bromine, and 1 ppm by weight or below for chlorine as each element.

The mixture solution obtained as described above and containing hydrolysates (silicon compound) of the components for forming silica-based coating film was put in a flask of a rotary evaporator (R-114 produced by Shibata Scientific Technology CO., Ltd.), and furthermore a mixture solvent containing pure water by 50% by weight and propylene glycol monomethyl ether by 50% by weight was added at the mixing ratio shown in Table 1 for solvent substitution of ethanol contained in the mixture solution with propylene glycol monomethyl ether (PGME, produced by Kyowa Hakko Chemical CO., Ltd.). In this step, the rotary evaporator was run at the temperature of 70° C. under a pressure of −0.09 MPa (in the decompressed state) to rotate the flask at the rotating speed of 70 rpm.

As a result, a liquid composition containing the silicon compounds, propylene glycol monomethyl ether, ethanol and water at the contents shown in Table 1 was obtained.

Then the 100 grams fractions of the liquid composition were taken out, and pure water and/or propylene glycol monomethyl ether was added to each of the fraction, and contents of water and silicon compounds in the liquid composition was adjusted, and the sample was agitated for one hour at the rotational speed of 200 rpm. With the operation as described above, liquid compositions each having the compositions shown in Table 2 (coating liquid for formation of a coating film) were obtained. Contents (weight %) of the silicon compounds shown in Table 2 were measured by converting from the quantities of residual solid materials obtained by drying a portion of each of the liquid compositions at the temperature of 150° C. (When the liquid composition is dried at the temperature of 150° C., the organic solvent and water contained in the liquid composition are evaporated as they are, and tetramethyl ammonium hydroxide (TMAOH) and the like are decomposed and evaporated, so that the silicon compounds remain as solid materials). The number average molecular weight of the silicon compounds is expressed in terms of polyethylene oxide.

5 ml of the coating liquid for formation of a coating film obtained as described above was dripped by the known spin coat method (with ACT-8 produced by Tokyo Electron Co., Ltd.) onto an 8-inch silicon wafer substrate, and a coating process was carried out for 20 seconds at the rotational speed of 2000 rpm. A plurality of substrates having been subjected to the coating process was obtained by repeating the operations described above.

The substrates are placed on a sheet-feed type hot plate (produced by Tokyo Electron Co., Ltd.), and was heated for 3 minutes in a nitrogen gas atmosphere and at the temperature of 150° C. In this heating process, the organic solvents (PGME and ethanol) contained in the coating film are evaporated, and the vaporized materials were discharged to the outside.

Furthermore, in the state where the substrates were placed on the sheet-feed type hot plate, the substrates were cured in the nitrogen gas atmosphere for 30 minutes at 400° C. Then the substrates (substrates (1) to (5)) were cooled down to a temperature near the room temperature, and taken out from the system.

A thickness of the silica-based coating film formed on the substrate obtained as described above was about 100 nm (when measured with a spectroscopic ellipsometer ESVG produced by SOPRA).

Then the measurement was performed for properties of the silica-based coating film formed on the substrate, namely (i) an average diameter of the pores (by means of nitrogen adsorption method with Autosorb-1 produced by Quanta Chrome Co., Ltd.), (ii) a pore distribution (pore bulk ratios of micropores each having the diameter of 2 nm or below and mesopores each having a diameter of more than 2 nm by means of the nitrogen absorption method with Autosorb-1 produced by Quanta Chrome Co., Ltd.), (iii) a film strength (Young's modulus by means of nano-indentation method with Nano Indenter DCM produced by MTS System Co., Ltd.), (iv) a specific dielectric constant (by means of mercury probe method at a frequency of 1 MHz with SSM495 produced by Solid State Measurements CO., Ltd.), and (v) changes in a moisture adsorption rate before and after irradiation of oxygen plasma (by means of TDS method: Desorption Mass-Spectroscopy, with EMD-1000 produced by Denshi kagaku K. K.). The result is shown in Table 3.

It is to be noted that the processors, measuring equipment, and analyzers used in Example 1 were also used in Examples 2 to 4 and Comparative Examples 1, 2 as described below.

As a result, a liquid composition was obtained, and the liquid composition contained the silicon compounds by about 16% by weight, propylene glycol monomethyl ether by about 34% by weight, ethanol by about 12% by weight, and water by about 38% by weight.

Then 100 grams of the liquid composition was taken out, and a mixture solution containing pure water by 50% by weight and propylene glycol monomethyl ether by 50% by weight was added to the liquid composition to adjust contents of water and silicon compounds contained in the liquid compositions, and the mixture was agitated for one hour at the rotational speed of 200 rpm. With this operation, the liquid composition having the composition as shown in Table 2 (a coating liquid for formation of a coating film) was obtained. Contents of the silicon compounds shown in Table 2 (weight %) were measured by converting from the quantities of residual solid materials obtained by drying a portion of the liquid compositions at the temperature of 150° C. Furthermore, a number average molecular weight of the silicon compound is expressed in terms of polyethylene oxide.

5 ml of the coating liquid for formation of a coating film obtained as described above was applied on an 8-inch silicon

TABLE 1

Preparation of Liquid Composition

| Example substrate | Added material | | | | Solvent substitution | Composition of liquid composition before adjustment | | | |
|---|---|---|---|---|---|---|---|---|---|
| | TEOS (g) | MTMS (g) | ETOH (g) | TMAOH aqueous solution(g) (TMAOH:wt %) | PGME mixture solvent (g) | Silicon compound (wt %) | PGME (wt %) | ETOH (wt %) | Water (wt %) |
| (1) | 96.0 | 61.1 | 429.1 | 186.2(7.8) | 772.34 | 14.9 | 33.2 | 12.8 | 39.1 |
| (2) | 76.4 | 73.3 | 429.1 | 186.2(7.8) | 764.95 | 15.3 | 33.9 | 10.1 | 40.7 |
| (3) | 57.6 | 85.5 | 429.1 | 186.2(7.8) | 758.34 | 16.7 | 34.2 | 11.6 | 37.5 |
| (4) | 96.0 | 61.1 | 429.1 | 180.7(6.5) | 766.89 | 16.0 | 31.1 | 14.2 | 38.7 |
| (5) | 96.0 | 61.1 | 429.1 | 186.2(7.8) | 772.34 | 14.9 | 33.2 | 12.8 | 39.1 |

EXAMPLE 2

41.4 grams of tetramethyl orthosilicate (TMOS, produced by Tama Chemicals Co. Ltd.), 85.5 grams of methyl trimethoxysilane (MTMS produced by Shin-Etsu Chemical Co., Ltd) and 476.6 grams of ethanol with the concentration of 99.5% by weight (ETOH produced by Wako Pure Chemical Industries, Ltd.) were mixed, and the mixture solution was kept at the temperature of 20° C., and was agitated for 30 minutes at the rotational speed of 150 rpm.

186.2 grams of the aqueous solution of tetramethyl ammonium hydroxide (containing TMAOH by 7.8% by weight) used in Example 1 was dripped in the mixture solution over 10 minutes, and furthermore the resultant mixture solution was agitated for one hour at the temperature of 20° C. and at the rotational speed of 150 rpm. Then the mixture solution was heated up to the temperature of 50° C. and agitated for 20 hours at the temperature and at the rotational speed of 200 rpm to hydrolyze components for forming silica-based coating film (TMOS and MTMS).

Then, under the same conditions employed in Example 1, the mixture solution containing hydrolysates (silicon compounds) of the components for forming silica-based coating film obtained as described above was put in a flask of a rotary evaporator (R-114 produced by Shibata Scientific Technology CO., Ltd.), and furthermore 789.59 grams of mixture solvent containing pure water by 50% by weight and propylene glycol monomethyl ether by 50% was put in the flask to substitute ethanol contained in the mixture solution with propylene glycol monomethyl ether (PGME, Kyowa Hakko Chemical CO., Ltd.).

wafer substrate by means of the spin coat method under the same conditions as those employed in Example 1.

The substrates are placed on a sheet-feed type hot plate, and were heated for 3 minutes in a nitrogen gas atmosphere and at the temperature of 150° C. In this heating process, the organic solvents (PGME and ethanol) contained in the coating film are evaporated, and the vaporized materials were discharged to the outside.

The substrate was placed on a sheet-feed type hot plate and was heated in the nitrogen gas atmosphere for 30 minutes at the temperature of 400° C. Then the substrate (Example substrate (6)) was cooled down to a temperature near the room temperature, and was taken out to the outside of the system.

A thickness of the silica-based coating film formed on the substrate obtained as described above was about 100 nm (when measured with a spectroscopic ellipsometer ESVG produced by SOPRA).

Then, like in the case of Example 1, measurement was made for (i) an average pore diameter, (ii) a pore distribution, (iii) a film strength, (iv) a specific dielectric constant, and (v) changes in moisture adsorption in the coating film before and after irradiation of oxygen plasma. The result is shown in Table 3.

EXAMPLE 3

96.0 grams of tetraethyl orthosilicate (TEOS produced by Tama Chemicals Co. Ltd.), 79.77 grams of methyl triethoxysilane (MTES produced by Shin-Etsu Chemical Co., Ltd) and 463.1 grams of ethanol with the concentration of 99.5% by weight (ETOH produced by Wako Pure Chemical Industries, Ltd.) were mixed, and the mixture solution was kept at the temperature of 20° C. and agitated for 30 minutes at the rotational speed of 150 rpm.

A mixture solution comprising 58.2 grams of the aqueous solution of tetramethyl ammonium hydroxide used in Example 1 (containing TMAOH by 25% by weight), 54.2 grams of an aqueous solution of tetrapropyl ammonium hydroxide (containing TPAOH by 15% by weight) purified by the method described in Comparative Example 2 below, and 93.9 grams of pure water was dripped in the mixture solution above over 10 minutes, and furthermore the resultant mixture solution was agitated at the temperature of 20° C. at the rotational speed of 150 rpm. Then the mixture solution was heated up to the temperature of 50° C., and was agitated for 20 hours at the same temperature and at the rotational speed of 200 rpm to hydrolyze components for forming silica-based coating film (TEOS and MTES).

Then, under the same conditions as those employed in Example 1, the mixture containing hydrolysates (silicon compounds) of the components for forming silica-based coating film obtained as described above was put in a flask of a rotary evaporator (R-114 produced by Shibata Scientific Technology CO., Ltd.), and furthermore 845.23 grams of a mixture solution containing pure water by 50% by weight and propylene glycol by 50% by weight was put in the flask to subject ethanol contained in the mixture solution to solvent substitution with propylene glycol monomethyl ether (PGME produced by Kyowa Hakko Chemical CO., Ltd.).

As a result, a liquid composition was obtained, and the liquid composition contained the silicon compounds by about 16% by weight, propylene glycol monomethyl ether by about 35% by weight, ethanol by about 12% by weight, and water by about 37% by weight.

Then 100 grams of the liquid composition was taken out, and a mixture solution containing pure water by 50% by weight and propylene glycol methyl ether by 50% by weight was added to the liquid composition to adjust contents of water and silicon compounds contained in the liquid composition, and the mixture solution was agitated for one hours at the rotational speed of 200 rpm. With the operations described above, the liquid composition (components for forming silica-based coating film) having the composition as shown in Table 2 was obtained. A content of the silicon compound (weight %) shown in Table 2 was measured by converting from the quantities of residual solid materials obtained by drying a portion of the liquid composition at the temperature of 150° C. A number average molecular weight of the silicon compounds was expressed in terms of polyethylene oxide.

5 ml of the coating liquid for formation of a coating film obtained as described above was applied on a 8-inch silicon wafer by means of the spin coat method under the same conditions as those employed in Example 1.

Then the substrate was placed on a sheet-feed type hot plate, and was heated for 3 minutes at the temperature of 150° C. in the nitrogen gas atmosphere. Because the organic solvent and the like (PGME and ethanol) contained in the coating film were evaporated, and the vaporized materials were discharged to the outside.

Furthermore, in the state where the substrate was placed on the sheet-feed type hot plate, the substrate was cured for 30 minutes at the temperature of 400° C. in the nitrogen gas atmosphere. Then the substrate (Example substrate (7)) was cooled down to a temperature near the room temperature, and was taken out to outside of the system.

A thickness of the silica-based coating film formed on the substrate was about 100 nm (when measured with a Spectroscopic Ellipsometer ESVG produced by SOPRA).

Then, like in Example 1, measurement was made for (i) an average pore diameter, (ii) a pore distribution, (iii) a film strength, (iv) a specific dielectric constant, and (v) changes in a quantity of moisture adsorbed in the coating film before and after irradiation of oxygen plasma. The result is as shown in Table 2.

EXAMPLE 4

96.0 grams of tetraethyl silicate (TEOS produced by Tama Chemicals Co. Ltd.) and 262 grams of ethanol with the concentration of 99.5% by weight (ETOH produced by Wako Pure Chemical Industries, Ltd.) were mixed with each other, and the mixture solution was kept at the temperature of 20° C. and agitated for 30 minutes at the rotational speed of 150 rpm. Then 112 grams of the aqueous solution of tetramethyl ammonium hydroxide used in Example 1 (containing TPAOH by 6.5% by weight) was dripped in the mixture solution over 10 minutes, and the resultant mixture solution was agitated for 2 hours at the temperature of 20° C. and at the rotational speed of 150 rpm. Then the mixture solution was heated up to the temperature of 50° C., and was agitated for 40 hours at the same temperature and at the rotational speed of 200 rpm to hydrolyze tetraethyl orthosilicate.

Then a mixture solution of 61.1 grams of methyl trimethoxysilane (MTMS produced by Shin-Etsu Chemical Co., Ltd) and 262 grams of ethanol with the concentration of 99.5% by weight (ETOH produced by Wako Pure Chemical Industries, Ltd.) was mixed in the mixture solution above, and the resultant mixture solution was agitated for 10 minutes at the temperature of 20° C. and at the rotational speed of 150 rpm. Then 112 grams of the aqueous solution of tetramethyl ammonium hydroxide (containing TPAOH by 6.5% by weight) was dripped in the mixture solution over 10 minutes, and the mixture solution was agitated for one hour at the temperature of 20° C. and at the rotational speed of 150 rpm. Then the mixture solution was heated up to 50° C. and agitated for 25 hours at the same temperature and at the rotational speed of 200 rpm to hydrolyze methyl trimethoxysilane and other components to be hydrolyzed (such as a partial hydrolysate of tetraethyl orthosilicate).

Then, under the same conditions as those employed in Example 1, the mixture solution containing hydrolysates of the components for forming silica-based coating film obtained as described above (silicon compounds) was put in a flask of a rotary evaporator (R-114 produced by Shibata Scientific Technology CO., Ltd.), and furthermore 905.1 grams of a mixture solution containing pure water by 50% by weight and propylene glycol ether by 50% by weight was put in the flask to subject ethanol contained in the mixture solution to solvent substitution with propylene glycol monomethyl ether (PGME produced by Kyowa Hakko Chemical CO., Ltd.).

As a result, a liquid composition was obtained, and the liquid composition contained the silicon compounds by about 15% by weight, propylene glycol monomethyl ether by about 36% by weight, ethanol by about 16% by weight, and water by about 34% by weight.

Then 100 grams of the liquid composition was taken out, and a mixture solution containing pure water by 50% by weight and propylene glycol monomethyl ether by 50% by weight was added to the liquid composition to adjust contents of water and silicon compounds contained in the liquid composition, and the mixture solution was agitated for one hours at the rotational speed of 200 rpm. With the operations described above, the liquid composition having the composition as shown in Table 2 was obtained. A content of the silicon compound (weight %) shown in Table 2 was measured by converting from the quantities of residual solid materials obtained by drying a portion of the liquid composition at the temperature of 150° C. A number average molecular weight of the silicon compounds was expressed in terms of polyethylene oxide.

5 ml of the coating liquid for formation of a coating film obtained as described above was applied on a 8-inch silicon wafer by means of the spin coat method under the same conditions as those employed in Example 1.

Then the substrate was placed on a sheet-feed type hot plate, and was heated for 3 minutes at the temperature of 150° C. Because the organic solvent and the like (PGME and ethanol) contained in the coating film were evaporated, and the vaporized materials were discharged to the outside.

Furthermore, the substrate was placed on a sheet-feed hot plate, and in this state, an electron beam with an acceleration voltage of 13 KV was irradiated at 500 μC/cm$^2$ (with miniEB produced by Ushio Electric CO., Ltd.) for 30 minutes at the temperature of 300° C. in the nitrogen gas atmosphere for curing. Then the substrate (Example substrate (8)) was cooled down to a temperature near the room temperature, and was taken out to outside of the system.

A thickness of the silica-based coating film formed on the substrate was about 100 nm (when measured with a Spectroscopic Ellipsometer ESVG produced by SOPRA).

Then, like in Example 1, measurement was made for (i) an average pore diameter, (ii) a pore distribution, (iii) a film strength, (iv) a specific dielectric constant, and (v) changes in a quantity of moisture adsorbed in the coating film before and after irradiation of oxygen plasma. The result is as shown in Table 3.

COMPARATIVE EXAMPLE 1

100-grams fractions of the liquid composition prepared in Example 1 were taken out, and pure water and/or propylene glycol monomethyl ether were added to adjust contents of water and silicon compounds contained in the fractions of the liquid composition, and then the fractions of liquid composition were agitated for one hour at the rotational speed of 200 rpm. With the operations described above, the liquid compositions (coating liquids for formation of a coating film) each having the composition as shown in Table 2 were obtained. A content (weight %) of each silicon compound shown in Table 2 was measured by converting from the quantities of residual solid materials obtained by drying a portion of each liquid composition at the temperature of 150° C. Furthermore, a number average molecular weight of the silicon compounds is expressed in terms of polyethylene oxide.

5 ml of the coating liquid for formation of a coating liquid obtained as described above was applied on an 8-inch silicon wafer by the spin coat method under the same conditions as those employed in Example 1. The operations were repeated to obtain a plurality of substrates each with the coating liquid applied thereon.

Then the substrates were placed on a sheet-feed hot plate and were heated under the same conditions as those employed in Example 1. In the heating process, the organic solvent and the like contained in the coating film (such as PGME and ethanol) were evaporated, and the vaporized materials were discharged to outside of the system. Furthermore, in the state where the substrates were placed on the sheet-feed type hot plate, and were heated under the same conditions as those employed in Example 1. Then the substrates (Comparative example substrates (1) to (2)) were cooled down to a temperature near the room temperature, and were taken out to outside of the reaction system.

A thickness of the silica-based coating film formed on the substrate obtained as described above was about 100 nm (when measured with a Spectroscopic Ellipsometer ESVG produced by SOPRA).

Then, like in Example 1, measurement was made for (i) an average pore diameter, (ii) a pore distribution, (iii) a film strength, (iv) a specific dielectric constant, and (v) changes in a quantity of moisture adsorbed in the coating film before and after irradiation of oxygen plasma. The result is as shown in Table 3.

COMPARATIVE EXAMPLE 2

300 grams of a cation-exchange resin powder (WK-40 produced by Mitsubishi Chemicals CO. Ltd.) was added to 1 kg of an aqueous solution containing tetrapropyl ammonium hydroxide (TPAOH produced by Lion Co., Ltd) by 40% by weight, and the mixture solution was agitated at the room temperature for one hour at the rotational speed of 100 rpm, and then the cation-exchange resin powder was removed by filtering. Then 2100 grams of an anion-exchange resin powder (SAT-110 produced by Mitsubishi Chemicals. Co. Ltd.) were added to the solution, and the mixture solution was agitated for one hour at the room temperature and at the rotational speed of 100 rpm. Then the anion-exchange resin powder was removed by filtering.

Ultrapure water was added to an aqueous solution of the tetrapropyl ammonium hydroxide (TPAOH) obtained as described above to adjust the concentration of TPAOH to 10% by weight, and then contents of compounds of alkali metal elements such as sodium (Na) and potassium (K) as well as compounds of halogen group elements such as bromine (Br) and Chloride (Cl) contained in the aqueous solution as impurities were measured by the atomic absorption method (by AAS method and with Zeeman Atomic Absorption Meter Z-5710 produced by Hitachi Co., Ltd.) and by the ion chromatography method (with 2020i produced by DIONEX).

Furthermore, ultrapure water was added to the aqueous solution of tetrapropyl ammonium hydroxide (market product) before being subjected to the ion exchange processing to adjust the concentration of TPAOH to 10% by weight, and contents of impurities were measured.

As a result, contents of the impurities contained in the aqueous solution before being subjected to the ion exchange processing were 50 ppm by weight of sodium, 2500 ppm by weight of potassium, 2250 ppm by weight of bromine, and 13 ppm by weight of chlorine as each element base, while, after having been subjected to the ion-exchange processing, the contents were 10 ppb by weight or below (which is a lower limit for detection) of sodium, 10 ppb by weight (which is a lower limit for detection) of potassium, 1 ppm by weight of bromine, and 1 ppm by weight of chlorine as each element base. Namely, the aqueous solution of tetrapropyl ammonium hydroxide (market product) was highly purified to a high level required in the present invention.

85.71 grams of tetraethyl orthosilicate (TEOS produced by Tama Chemicals Co. Ltd.), 127.27 grams of methyl trimethoxysilane (MTMS, produced by Shin-Etsu Chemical Co., Ltd), and 467.9 grams of ethanol with the concentration of 99.5% by weight (ETOH, Wako Pure Chemical Industries, Ltd.) were mixed, and the mixture solution was kept at the temperature of 20° C. and agitated for 30 minutes at the rotational speed of 150 rpm.

298.3 grams of the highly purified aqueous solution of tetrapropyl ammonium hydroxide (containing TPAOH by 10% by weight) was dripped in the mixture solution above over 10 minutes, and the resultant mixture solution was agitated for one hour at the temperature of 20° C. and at the rotational speed of 200 rpm. Then, the mixture solution was heated up to the temperature of 50° C. and was agitated for 20 hours at the same temperature and at the rotational speed of 200 rpm to hydrolyze the components for forming silica-based coating film (TEOS and MTMS).

Then a mixture solution containing the hydrolysates (silicon compounds) of the components for forming silica-based coating film obtained as described above was put in a flask of a rotary evaporator (R-114 produced by Shibata Scientific Technology CO., Ltd.), and furthermore 1000 grams of a mixture solvent containing pure water by 50% by weight and propylene glycol monopropyl ether by 50% by weight was put in the flask to subject ethanol contained in the mixture solution to solvent substitution with propylene glycol monopropyl ether (PGP produced by Nippon Nyukazai Co., Ltd).

As a result, a liquid composition was obtained, and the liquid composition contained the silicon compositions by about 16% by weight, propylene glycol monopropyl ether by about 43% by weight, ethanol by about 8% by weight, and water by about 33% by weight.

100 grams of this liquid composition was taken out, and a mixture solution containing pure water by 50% by weight and propylene glycol monopropyl ether by 50% by weight was added in the liquid composition to adjust contents of water and silicon compounds contained in the liquid composition, and then the mixture solution was agitated for one hour at the rotational speed of 200 rpm. With the operations described above, the liquid compositions (coating liquids for formation of a coating film) each having the composition shown in Table 2 were obtained. A content of each silicon compound shown in Table 2 (weight %) was measured by converting from the quantities of residual solid materials obtained by drying a portion of the liquid composition at the temperature of 150° C. Furthermore, a number molecular weight of the silicon compounds is expressed in terms of polyethylene oxide.

5 ml of the coating liquid for formation of a coating film obtained as described above was dripped on an 8-inch silicon wafer substrate by the known spin coat method (with ACT-8 produced by Tokyo Electron Co., Ltd.) and was applied for 20 seconds at the rotational speed of 2000 rpm.

Then the substrate was placed on a sheet-feed type hot plate, and was heated for 3 minutes at the temperature of 150° C. in the nitrogen gas atmosphere. During this heating process, the organic solvent and the like contained in the coating film (such as PGP and ethanol) were evaporated, and the vaporized materials were discharged to the outside.

Furthermore, in the state where the substrate was placed on a sheet-feed type hot plate, and was cured for 30 minutes at the temperature of 400° C. in the nitrogen gas atmosphere. Then the substrate (comparative example substrate (3)) was cooled down to a temperature near the room temperature, and then was taken out to outside of the system.

A thickness of the silica-based coating film formed on the substrate obtained as described above was about 100 nm (when measured with a Spectroscopic Ellipsometer ESVG produced by SOPRA).

Then, like in Example 1, measurement was made for (i) an average pore diameter, (ii) a pore distribution, (iii) a film strength, (iv) a specific dielectric constant, and (v) changes in a quantity of moisture adsorbed in the coating film before and after irradiation of oxygen plasma. The result is as shown in Table 2.

The coating liquid for formation of a coating film shown in Comparative Example 2 relates to an amorphous silica-based coating liquid having a low specific constant described in Patent document 1, and was developed by the present inventors mainly for formation of an inter-layer insulating film.

TABLE 2

Characteristics of Liquid Composition (Coating Liquid for Formation of a Coating Film)

| | | Composition of liquid composition after adjustment | | | | | Number average molecular weight |
|---|---|---|---|---|---|---|---|
| Example substrates | Comp. Example substrates | Silicon compound (wt %) | PGME (wt %) | PGP (wt %) | ETOH (wt %) | Water (wt %) | of silicon compounds (PEO-based) |
| (1) | | 2.6 | 47.1 | 0.0 | 2.2 | 48.1 | 15000 |
| (2) | | 2.8 | 55.2 | 0.0 | 1.8 | 40.1 | 18000 |
| (3) | | 2.7 | 43.3 | 0.0 | 1.9 | 52.2 | 20000 |
| (4) | | 2.6 | 57.0 | 0.0 | 2.3 | 38.1 | 22000 |
| (5) | | 2.7 | 33.9 | 0.0 | 2.3 | 61.1 | 15000 |
| (6) | | 2.5 | 47.6 | 0.0 | 1.9 | 48.0 | 18000 |
| (7) | | 2.6 | 47.5 | 0.0 | 2.0 | 47.9 | 12000 |
| (8) | | 2.7 | 47.5 | 0.0 | 2.8 | 47.0 | 15000 |
| | (1) | 2.6 | 62.8 | 0.0 | 2.2 | 32.4 | 15000 |
| | (2) | 2.6 | 28.9 | 0.0 | 2.2 | 66.3 | 15000 |
| | (3) | 3.5 | 0.0 | 59.5 | 1.8 | 35.4 | 20000 |

TABLE 3

Physical Properties of Coating Film

| Example Substrate | Comp. example substrate | Average pore diameter(nm) | | | Pore volume (%) | | Young's modulus of coating film (GPa) | ε | Changes in moisture adsorption rate |
|---|---|---|---|---|---|---|---|---|---|
| | | Micro pore | Meso pore | All | Micro pore | Meso Pore | | | |
| (1) | | 0.9 | 3.8 | 2.0 | 83 | 17 | 13 | 2.9 | Normal |
| (2) | | 1.0 | 3.9 | 2.3 | 80 | 20 | 12 | 2.8 | Normal |
| (3) | | 1.2 | 3.9 | 2.6 | 76 | 24 | 11 | 2.7 | Normal |
| (4) | | 1.0 | 3.9 | 2.2 | 82 | 18 | 12 | 2.8 | Normal |
| (5) | | 1.0 | 3.7 | 2.0 | 82 | 18 | 13 | 2.9 | Normal |
| (6) | | 0.9 | 3.8 | 2.0 | 78 | 22 | 12 | 2.8 | Normal |
| (7) | | 0.8 | 3.9 | 2.0 | 77 | 23 | 11 | 2.7 | Normal |
| (8) | | 0.9 | 3.6 | 1.8 | 90 | 10 | 16 | 3.0 | Normal |
| | (1) | — | — | — | — | — | — | — | (Note 1) |
| | (2) | — | — | — | — | — | — | — | (Note 2) |
| | (3) | 1.2 | 3.9 | 2.7 | 70 | 30 | 7 | 2.5 | Normal |

ε: Specific dielectric constant
(Note 1)
Dispersibility of silica-based components (silicon compounds) contained in the liquid composition is poor, so that a desired coating film could not be formed.
(Note 2)
Because the surface tension of the liquid composition was high, the coating liquid was repelled on a surface of the substrate, and a desired coating film could not be formed.

As clearly understood from Table 3, the silica-based coating film formed with the coating liquid for formation of a protective film for semiconductor processing according to the present invention has a high film strength of 8.0 GPa or more, specifically 10.0 GPa or more as expressed by the Young's modulus and a low specific dielectric constant of 3.0 or below and more specifically in the range from 2.7 to 3.0. Furthermore, it has been found that, in the protective film for semiconductor processing according to the present invention, an average diameter of pores of the protective film is 3 nm or below; the pore volume of micropores each having a diameter of 2 nm or below is 75% or more in percentage to the total pore volume; a maximum pore diameter of the pores is 10 nm or below; and an average diameter of mesopores each having a diameter of more than 2 nm is 4 nm or below. Although not shown in Table 3, any pores having a diameter of more than 10 nm are not found in the coating films formed on the example substrates.

In contrast, it has been found that, in the silica-based coating film prepared in the comparative examples, it is impossible to achieve high film strength and a low specific dielectric constant required for a protective film for semiconductor processing. More specifically, it has been found that the problems as described below occur in the substrates prepared in Comparative Example 1 (comparative example substrates (1) and (2)) and the obtained substrates can not practically be used. Namely, in the comparative example substrate (1), dispersibility of silica-based components contained in the liquid composition (a coating liquid) with the water content of 32.4% by weight, a desired coating film can not be formed. When the coating liquid is left in the atmosphere, sometimes changes such as increase of the molecular weights occur, and it has been found that, as a result of the phenomenon above, life of the coating liquid is extremely short. Furthermore, in the comparative example substrate (2), since a surface tension of the liquid composition (a coating liquid) with the water content of 66.3% by weight is high (namely, low in the wetting property), the coating liquid is repelled on a surface of the substrate, and as a result, pin holes or the like are generated in the coating film, which makes it impossible to form a homogeneous film.

Furthermore, with the substrate prepared in Comparative Example 2 (namely, comparative example substrate (3)), it has been found that, although it is possible to achieve a low specific dielectric constant required for an inter-layer insulating film, when the coating film is cured by heating, a percentage of pore volume of the micropores each having a diameter of 2 nm or below is around 70% and a Young's modulus of the coating film is around 7.0 GPa.

EXAMPLE 5

5 ml of the coating liquid for formation of the coating film prepared for example substrate (1) above was dripped by the known spin coat method (with ACT-8 produced by Tokyo Electron Co., ltd.) onto an 8-inch silicon wafer substrate 1, and a coating process was carried out for 20 seconds at the rotational speed of 2000 rpm. Then substrate is placed on a sheet-feed type hot plate, and was heated for 3 minutes in a nitrogen gas atmosphere and at the temperature of 150° C. In this heating process, the organic solvents and the like (PGME and ethanol) contained in the coating film were evaporated, and the vaporized materials were discharged to the outside. Furthermore, in the state where the substrate was placed on the sheet-feed type hot plate, the substrate was cured for 30 minutes at the temperature of 400° C. in the nitrogen gas atmosphere to form an etching stopper film 2. A thickness of the silica-based coating film formed on the substrate was about 100 nm (when measured with a Spectroscopic Ellipsometer ESVG produced by SOPRA).

Then, 5 ml of the coating liquid for formation of the coating film prepared for comparative example substrate (3) above was dripped by the known spin coat method (with ACT-8 produced by Tokyo Electron Co., ltd.) onto the substrate on which the etching stopper film 2 is formed, and a coating process was carried out for 20 seconds at the rotational speed of 2000 rpm. Then the substrate was placed on the sheet-feed type hot plate, and was heated for 3 minutes at the temperature of 150° C. in the nitrogen gas atmosphere. Because the organic solvent and the like (PGME and ethanol) contained in the coating film were evaporated, the vaporized materials were discharged to the outside. Furthermore, in the state where the substrate was placed on the sheet-feed type of hot plate, the substrate was cured for 30 minutes at the temperature of 400° C. in the nitrogen gas atmosphere to form interlayer insulating film 3. A thickness of the silica-based coating film formed on the substrate was about 200 nm (when measured with a Spectroscopic Ellipsometer ESVG produced by SOPRA).

Then, 5 ml of the coating liquid for formation of the coating film prepared for example substrate (2) above was dripped by the known spin coat method (with ACT-8 produced by Tokyo Electron Co., ltd.) onto the substrate on which the interlayer insulating film 3 is formed, and the coating process was carried out for 20 seconds at the rotational speed of 2000 rpm. Then, the substrate was placed on the sheet-feed type hot plate, and was heated for 3 minutes in a nitrogen gas atmosphere and at the temperature of 150° C. In this heating process, the organic solvents and the like (PGME and ethanol) contained in the coating film were evaporated, and the vaporized materials were discharged to the outside. Furthermore, in the state where the substrate is placed on the sheet-feed type hot plate, the substrate was cured in the nitrogen gas atmosphere for 30 minutes at the temperature of 400° C. to form CMP sacrifice film 4. A thickness of the silica-based coating film formed on the substrate obtained as described above was about 100 nm (when measured with a spectroscopic Ellipsometer ESVG produced by SOPRA).

Then, by the known plasma etching method (Reactive Ion Etching Device DEM-451T produced by ANELVA) using fluorine-based gas ($CF_4$, $O_2$), an etching was carried out to form via holes. In the etching process, etching was made to the etching stopper film 2.

Then, by the known spattering method (PVD, INOVA produced by Novellas), copper barrier metal layer 5 was formed. Then, by the known electrolytic plating method (SABER produced by Novellas), a copper layer 6 for interconnection was embedded in the barrier metal layer 5. Furthermore, by the known CMP device (AVANTI 472, speed firm produced by IPAC), the copper layer and the barrier metal layer formed on the substrate were scraped off. In the scraping process, a portion of CMP sacrifice film 3 was scraped off.

FIG. 1 is a conceptual cross-sectional view illustrating the semiconductor substrate obtained through the operations above. Results of measurement of physical properties of the etching stopper film 2 and CMP sacrifice film 4 when and after the preparation of the semiconductor substrates are described below.

Etching Stopper Film

An etching rate of the etching stopper film was 28 nm per min, when measured under the following conditions; using fluorine plasma gas ($CF_4$: 45 sccm, $O_2$: 5 sccm), 250 w of high frequency electricity, and 10 Pa of operational pressure (reduced pressure). The etching rate of the interlayer insulating film was 83 nm per min. The etching rate of the etching stopper film was 1.3 times larger than the etching rate of the interlayer insulating film.

CMP Sacrifice Film a) Polishing Rate

Polishing rate of the CMP sacrifice film measured by using slurry including colloidal silica was 19.6 nm per min, under the following conditions; slurry flow rate was 150 cc per minute, load pressure was 2 psi, table rotation rate was 28 rpm, and polishing time was 60 seconds. In contrast, polishing rate of the CMP sacrifice film of tantalum (Ta) manufactured for comparison was 22.5 nm per min.

b) Adhesiveness

When a surface of the CMP sacrifice film which was polished under the conditions described in a) above was observed by a naked eye and a microscope, a peeling-off of the film was not confirmed. Furthermore, 25 lattices, size of which was 3 mm sq, were prepared through cutting by a cutting instrument. A commercially available adhesive tape was pasted onto the lattice, the tape was peeled off quickly, and then the lattice was observed. As the result of the observation through taping method, the peeling-off of the film was not confirmed.

c) Plasma Resistance

Changes of the quality of the film including a thickness of the film, a refractive index, a specific dielectric constant, a current leak, and relative compositions of the film were measured by using the fluorine plasma gas ($CF_4$: 45 sccm, $H_2$: 5 sccm) to perform plasma processing to the semiconductor substrate to which the CMP processing was performed under the following conditions; 250 w of high frequency electricity, and 10 Pa of operational pressure (reduced pressure). There were no changes confirmed in any of the qualities observed.

d) Chemical Resistance

The surface of the semiconductor substrate to which the CMP processing was performed was cleansed by using weakly acidic liquid (solution including citric acid and oxalic acid), to observe changes of the quality of the film including a thickness of the film, a refractive index, a specific dielectric constant, a current leak, and relative compositions of the film. There were no changes confirmed in any of the qualities observed.

As evident from the above results, the silica-based film formed by using coating liquid for formation of the protection film for semiconductor processing, or the etching stopper film and CMP sacrifice film according to the present invention fully satisfy requirements of the current semiconductor producing industry.

What is claimed is:

1. A coating liquid for formation of a protective film for semiconductor processing having a Young's modulus of at least 8 GPa and a specific dielectric constant in a range from 2.7 to 3.0, the coating liquid consisting essentially of:
   (a) a silicon compound obtained by hydrolyzing tetraalkyl orthosilicate (TAOS) and alkoxysilane (AS) expressed by the following general formula (I) in the presence of tetramethyl ammonium hydroxide (TMAOH), optionally, tetrapropyl ammonium hydroxide (TPAOH), and water, wherein TMAOH functions as a catalyst for the hydrolysis reaction and as a template material for the protective film, $$X_n Si(OR)_{4-n} \quad (I)$$

,wherein
   X denotes a hydrogen atom, a fluorine atom, an alkyl group having 1 to 8 carbon atoms, a fluorine-substituted alkyl group, an aryl group, or a vinyl group, and
   R denotes a hydrogen atom, an alkyl group having 1 to 8 carbon atoms, an aryl group, or a vinyl group, and n is an integer from 1 to 3;
   (b) an organic solvent including propylene glycol monomethyl ether (PGME); and
   (c) water, wherein the water comprises 35% to 65% by weight of the liquid composition.

2. The coating liquid for formation of a protective film for semiconductor processing according to claim 1, wherein the silicon compound is obtained by:
   (i) hydrolyzing or partially hydrolyzing tetraalkyl orthosilicate (TAOS) in the presence of tetramethyl ammonium hydroxide (TMAOH) and water;

(ii) mixing the hydrolyzed or partially hydrolyzed product with alkoxysilane (AS) expressed by the general formula (I), or a hydrolyzed or partially hydrolyzed product thereof; and (iii) hydrolyzing all or a portion of the mixture containing the reaction product of step (i) and the alkoxysilane (AS).

3. The coating liquid for formation of a protective film for semiconductor processing according to claim 1, wherein the tetraalkyl orthosilicate (TAOS) is selected from the group consisting of tetraethyl orthosilicate (TEOS), tetramethyl orthosilicate (TMOS), and a mixture thereof.

4. The coating liquid for formation of a protective film for semiconductor processing according to claim 1, wherein the alkoxysilane (AS) is selected from the group consisting of methyl trimethoxysilane (MTMS), methyl triethoxysilane (MTES), and a mixture thereof.

5. The coating liquid for formation of a protective film for semiconductor processing according to claim 1, wherein the silicon compound is obtained by hydrolyzing the tetraalkyl orthosilicate (TAOS) and the alkoxysilane (AS) in the presence of tetrapropyl ammonium hydroxide (TPAOH), in addition to tetramethyl ammonium hydroxide (TMAOH) and water.

6. The coating liquid for formation of a protective film for semiconductor processing according to claim 1, wherein number average molecular weight of the silicon compound is in a range from 10000 to 100000 in terms of polyethylene oxide.

7. The coating liquid for formation of a protective film for semiconductor processing according to claim 1, wherein content of the silicon compound is in a range from 0.1 to 10% by weight of the liquid composition.

8. A method of preparing a coating liquid for formation of a protective film for semiconductor processing having a Young's modulus of at least 8 GPa and a specific dielectric constant in a range from 2.7 to 3.0, the method of preparation consisting essentially of:

(a) preparing a liquid composition containing a silicon compound obtained by hydrolyzing tetraalkyl orthosilicate (TAOS) and alkoxysilane (AS) expressed by the following general formula (I), which are contained in an organic solvent, tetramethyl ammonium hydroxide (TMAOH) and, optionally, tetrapropyl ammonium hydroxide (TPAOH), and water,

$$X_nSi(OR)_{4-n} \quad (I)$$

, wherein
X denotes a hydrogen atom, a fluorine atom, an alkyl group having 1 to 8 carbon atoms, a fluorine-substituted alkyl group, an aryl group, or a vinyl group, and R denotes a hydrogen atom, an alkyl group having 1 to 8 carbon atoms, an aryl group, or a vinyl group; and n is an integer from 1 to 3;

(b) substituting at least a portion of an organic solvent contained in the liquid composition obtained in step (a) with propylene glycol monomethyl ether (PGME); and (c) adjusting quantity of the silicon compound contained in the liquid composition obtained in step (b), dependent upon a type or an application of a protective film for semiconductor processing to be formed, and adjusting water content of the liquid composition to a range from 35% to 65% by weight of the liquid composition.

9. The method of preparing a coating liquid for formation of a protective film for semiconductor processing according to claim 8, wherein the silicon compound is obtained by (i) hydrolyzing or partially hydrolyzing tetraalkyl orthosilicate (TAOS) which is contained in an organic solvent in the presence of tetramethyl ammonium hydroxide (TMAOH) and water;

(ii) mixing the hydrolyzed or partially hydrolyzed product with alkoxysilane (AS) expressed by the general formula (I), or a hydrolyzed or partially hydrolyzed product thereof, which is contained in an organic solvent; and (iii) hydrolyzing all or a portion of the mixture containing the reaction product of step (i) and the alkoxysilane (AS).

10. The method of preparing a coating liquid for formation of a protective film for semiconductor processing according to claim 8, wherein the organic solvent used in step (a) is an alcohol.

11. The method of preparing a coating liquid for formation of a protective film for semiconductor processing according to claim 8, wherein the tetraalkyl orthosilicate (TAOS) used in step (a) is selected from the group consisting of tetraethyl orthosilicate (TEOS), tetramethyl orthosilicate (TMOS), and a mixture thereof.

12. The method of preparing a coating liquid for formation of a protective film for semiconductor processing according to claim 8, wherein the alkoxysilane (AS) used in step (a) is selected from the group consisting of methyl trimethoxy silane (MTMS), methyl triethoxy silane (MTES), and a mixture thereof.

13. The method of preparing a coating liquid for formation of a protective film for semiconductor processing according to claim 8, wherein the liquid composition prepared in step (a) includes a silicon compound obtained by hydrolyzing the tetraalkyl orthosilicate (TAOS) and the alkoxysilane (AS) in the presence of tetrapropyl ammonium hydroxide (TPAOH), in addition to tetramethyl ammonium hydroxide (TMAOH) and water.

14. The method of preparing a coating liquid for formation of a protective film for semiconductor processing according to claim 8, including substituting the solvent in step (b) using a rotary evaporator.

15. The coating liquid for formation of a protective film for semiconductor processing according to claim 1, wherein the silicon compound is obtained by hydrolyzing tetraalkyl orthosilicate (TAOS) and alkoxysilane (AS) with a molar ratio of TAOS:AS in a range from 6:4 to 2:8, in terms of $SiO_2$, and a molar ratio of (TMAOH):(TAOS+AS) or (TMAOH+TPAOH):(TAOS+AS) in a range from 1:10 to 7:10, in terms of $SiO_2$.

16. The method of preparing a coating liquid for formation of a protective film for semiconductor processing according to claim 8, wherein the silicon compound is obtained by hydrolyzing tetraalkyl orthosilicate (TAOS) and alkoxysilane (AS) with a molar ratio of TAOS:AS in a range from 6:4 to 2:8, in terms of $SiO_2$, and a molar ratio of (TMAOH):(TAOS+AS) or (TMAOH+TPAOH):(TAOS+AS) in a range from 1:10 to 7:10, in terms of $SiO_2$.

* * * * *